United States Patent
Miyasaka

[11] Patent Number: 6,066,516
[45] Date of Patent: May 23, 2000

[54] METHOD FOR FORMING CRYSTALLINE SEMICONDUCTOR LAYERS, A METHOD FOR FABRICATING THIN FILM TRANSISTORS, AND METHOD FOR FABRICATING SOLAR CELLS AND ACTIVE MATRIX LIQUID CRYSTAL DEVICES

[75] Inventor: Mitsutoshi Miyasaka, Nagano, Japan

[73] Assignee: Seiko Epson Corporation, Tokyo, Japan

[21] Appl. No.: 08/776,545

[22] PCT Filed: Jun. 26, 1996

[86] PCT No.: PCT/JP96/01775

§ 371 Date: Jan. 31, 1997

§ 102(e) Date: Jan. 31, 1997

[87] PCT Pub. No.: WO97/01863

PCT Pub. Date: Jan. 16, 1997

[30] Foreign Application Priority Data

Jun. 26, 1995 [JP] Japan ................................ 7-159147
Jun. 21, 1996 [JP] Japan ................................ 8-161280

[51] Int. Cl.$^7$ .................................................. H01L 21/00
[52] U.S. Cl. ..................... 438/149; 438/166; 438/795; 438/486; 438/97
[58] Field of Search ................. 438/96, 97, 482, 438/486, 487, 488, 959, 795, 799, 149, 166; 117/3

[56] References Cited

U.S. PATENT DOCUMENTS 5,827,773  5/1998  Voutsas ................................ 438/488
5,858,819  1/1999  Miyasaka ............................. 438/149

FOREIGN PATENT DOCUMENTS

| | | |
|---|---|---|
| 62-104021 | 5/1987 | Japan . |
| 63-151014 | 6/1988 | Japan . |
| 3-72617 | 3/1991 | Japan . |
| 3-178124 | 8/1991 | Japan . |
| 3-292719 | 12/1991 | Japan . |
| 4-100210 | 4/1992 | Japan . |
| 4-298020 | 10/1992 | Japan . |
| 5-129332 | 5/1993 | Japan . |
| 6-216044 | 8/1994 | Japan . |
| 8-107067 | 4/1996 | Japan . |

OTHER PUBLICATIONS

Levinson, J., et al., "Conductivity Behavior in Polycrystalline Semiconductor Thin Film Transistors," *J. Appl. Phys.* 53(2), Feb. 1982, pp. 1193–1202.

Primary Examiner—Savitri Mulpuri
Attorney, Agent, or Firm—Oliff & Berridge, PLC.

[57] ABSTRACT

A crystalline semiconductor layer can be formed by forming a semiconductor film on an inexpensive conventional substrate. Next, perform a first annealing process in which nearly the entire surface of the semiconductor film is exposed to laser irradiation or other forms of irradiation, and then perform a second annealing process consisting of rapid thermal annealing. This enables the formation of a high quality crystalline semiconductor film with high throughput but without subjecting the substrate to undue thermal stress. When this invention is applied to thin film transistors, good transistors having high performance are easily fabricated. When this invention is applied to solar cells, energy conversion efficiency is increased.

9 Claims, 10 Drawing Sheets

METHOD FOR FORMING CRYSTALLINE SEMICONDUCTOR LAYERS, A METHOD FOR FABRICATING THIN FILM TRANSISTORS, AND METHOD FOR FABRICATING SOLAR CELLS AND ACTIVE MATRIX LIQUID CRYSTAL DEVICES

BACKGROUND OF THE INVENTION

1. Field of the Invention

This invention concerns a method for forming crystalline semiconductor layers and a method for fabricating thin film transistors, active matrix liquid crystal devices and solar cells that employ these crystalline semiconductor layers.

2. Description of the Related Art

Polycrystalline silicon and other semiconductor films are used widely in thin film transistors ("TFT" in the specifications of this application) and solar cells. The performance of these semiconductor devices is strongly dependent on the quality of the semiconductor layer, which wholly constitutes the active portion of the semiconductor device. Needless to say, if a high-quality semiconductor layer can be created, a semiconductor device with correspondingly high performance can be produced. For example, in a polycrystalline silicon thin film transistor (poly-Si TFT) used in such products as liquid crystal display devices, the higher the quality of the polycrystalline silicon (poly-Si) layer, the faster the switching speed of the TFT. Likewise, given roughly similar light absorption efficiency, a solar cell having a semiconductor layer with a higher degree of crystallinity will convert energy more efficiently. There is, therefore, strong demand in many industries for high quality crystalline semiconductor layers.

However, the formation of this kind of high quality semiconductor layer is generally difficult to achieve and, moreover, is subject to important limitations. In the field of TFTs, polycrystalline silicon layers having relatively high mobility are formed by fabricating transistors by means of a high temperature process where maximum process temperatures reach about 1000° C. Because of this, semiconductor films and semiconductor devices can be formed only on those substrates having thermal resistance properties that enable them to withstand high temperature processing. For this reason, all of today's poly-Si TFTs are formed on expensive, small quartz glass substrates. For the same reason, amorphous silicon (a-Si) is normally used for solar cells.

Against this backdrop, various research has been conducted on methods of forming high quality semiconductor layers at the lowest temperature possible. Solid-phase crystallization is known as the first such method. In this process, an a-Si film is formed on the substrate and then subjected to annealing at a temperature of approximately 600° C. for a minimum of 10 hours, thereby converting said a-Si film to a poly-Si layer. Laser crystallization is acknowledged to be the second process. In this method, an a-Si film is first deposited and then exposed to laser irradiation, thereby promoting crystallization of the silicon film.

However, the first of the conventional technologies (solid phase crystallization) requires annealing over a long period of time—more than 10 hours—and thus suffers from extremely poor throughput. Moreover, in this process thermal deformation of the substrate arising from prolonged heating of the entire substrate has become a major problem, meaning essentially that inexpensive, large glass substrates cannot be used. The problem with the second of the conventional technologies (laser crystallization) is that crystallization does not progress if the laser irradiation energy is too low, while high energy will damage the semiconductor film. Hence, satisfactory, high quality crystalline films cannot be produced under either of the irradiation conditions. Moreover, extensive nonuniformity in crystallinity is known to occur with each laser irradiation. The result is that even if these semiconductor films are applied in TFTs, for example, good transistor characteristics cannot be obtained.

Accordingly, a third method is being studied, which combines the second of the conventional technologies (laser crystallization) with a variation of the first (furnace annealing). This is a semiconductor film annealing process that is performed after the semiconductor film is crystallized by a laser. In this process the annealing temperature is lower (450° C. to 550° C.) than that used in solid-phase crystallization and the annealing time is shorter (one to five hours). Nevertheless, this process, too, has essentially the same problems as those of the first method. That is, even if the annealing temperature were kept to about 450° C., throughput would be poor because annealing would be required for at least several hours and, moreover, thermal distortion of the substrate could not be ignored.

Therefore, the aim of the present invention is to solve the aforementioned problems. The objective is to provide a method of forming high quality crystalline semiconductor layers with high throughput without subjecting the substrate to excessive thermal stress and, using this method, to provide a method of producing high performance thin film transistors and solar cells.

SUMMARY OF THE INVENTION

To solve the aforementioned problems in a method for forming crystalline semiconductor layers on a substrate, this invention is characterized by a semiconductor film deposition process in which a semiconductor film is deposited on a substrate, a first annealing process in which said semiconductor film is crystallized by repeatedly performing a process that melt crystallizes a portion of said semiconductor film, and a second annealing process in which rapid thermal annealing is performed on said crystallized semiconductor film. Here, the annealing temperature in the aforesaid second annealing process is expressed by the absolute temperature T [K] and, when the annealing time is t [seconds], annealing temperature T and annealing time t are characterized by the fact that the following relationship is satisfied:

$$1.72 \times 10^{-21}[sec] < t \cdot \exp(-\epsilon/kT)$$

($\epsilon=3.01$ [eV], $k=8.617 \times 10^{-5}$ [eV/K]: Boltzmann constant) Or, they are characterized by the fact that the following relationship is satisfied:

$$5 \times 10^{-18}[sec] < t \cdot \exp(-\epsilon/kT).$$

Or, they are characterized by the fact that the following relationship is satisfied:

$$1.72 \times 10^{-21}[sec] < t \cdot \exp(-\epsilon/kT) < 4.63 \times 10^{-14}[sec].$$

Or, they are characterized by the fact that the following relationship is satisfied:

$$5 \times 10^{-18}[sec] < t \cdot \exp(-\epsilon/kT) < 4.63 \times 10^{-14}[sec].$$

Or, they are characterized by the fact that the following relationship is satisfied:

$$1.72 \times 10^{-21}[sec] < t \cdot \exp(-\epsilon/kT) < 1.09 \times 10^{-15}[sec].$$

Or, they are characterized by the fact that the following relationship is satisfied:

$$5 \times 10^{-18} [sec] < t \cdot \exp(-\epsilon/kT) < 1.09 \times 10^{-15} [sec].$$

They are also characterized by the fact that when the two equations directly above are satisfied, the substrate is glass and annealing temperature T is below the strain point of said glass substrate. In addition, this invention is characterized by the fact that annealing time t is 300 seconds or less, and is also characterized by the fact that the annealing time t is 180 seconds or less.

In a method of forming crystalline semiconductor layers on a substrate, this invention is also characterized by a semiconductor film deposition process in which a semiconductor film is deposited on a substrate, a first annealing process in which said semiconductor film is repeatedly exposed to local laser irradiation, and a second annealing process in which rapid thermal annealing is performed on said laser-irradiated semiconductor film. Here, the annealing temperature in the aforementioned second annealing process is expressed by the absolute temperature T [K] and when the annealing time is t [seconds], annealing temperature T and annealing time t are characterized by the fact that the following relationship is satisfied:

$$1.72 \times 10^{-21} [sec] < t \cdot \exp(-\epsilon/kT)$$

($\epsilon = 3.01$ [eV], $k = 8.617 \times 10^{-5}$ [eV/K]: Boltzmann constant)
Or, they are characterized by the fact that the following relationship is satisfied:

$$5 \times 10^{-18} [sec] < t \cdot \exp(-\epsilon/kT)$$

Or, they are characterized by the fact that the following relationship is satisfied:

$$1.72 \times 10^{-21} [sec] < t \cdot \exp(-\epsilon/kT) < 4.63 \times 10^{-14} [sec].$$

Or, they are characterized by the fact that the following relationship is satisfied:

$$5 \times 10^{-18} [sec] < t \cdot \exp(-\epsilon/kT) < 4.63 \times 10^{-14} [sec].$$

Or, they are characterized by the fact that the following relationship is satisfied:

$$1.72 \times 10^{-21} [sec] < t \cdot \exp(-\epsilon/kT) < 1.09 \times 10^{-15} [sec].$$

Or, they are characterized by the fact that the following relationship is satisfied:

$$5 \times 10^{-18} [sec] < t \cdot \exp(-\epsilon/kT) < 1.09 \times 10^{-15} [sec].$$

They are also characterized by the fact that when the two equations directly above are satisfied, the substrate is glass, and annealing temperature T is below the strain point of said glass substrate. In addition, this invention is characterized by the fact that the annealing time t is 300 seconds or less, and is also characterized by the fact that the annealing time t is 180 seconds or less.

In addition, in a method of forming crystalline semiconductor layers on a substrate, this invention is characterized by a semiconductor film deposition process in which a semiconductor film is deposited on a substrate, a first annealing process in which said semiconductor film is repeatedly exposed to local high energy optical irradiation, and a second annealing process in which rapid thermal annealing is performed on said high energy optically irradiated semiconductor film. Here, the annealing temperature in the aforementioned second annealing process is expressed by the absolute temperature T [K] and when the annealing time is t [seconds], annealing temperature T and annealing time t are characterized by the fact that the following relationship is satisfied:

$$1.72 \times 10^{-21} [sec] < t \cdot \exp(-\epsilon/kT)$$

($\epsilon = 3.01$ [eV], $k = 8.617 \times 10^{-5}$ [eV/K]: Boltzmann constant).
Or, they are characterized by the fact that the following relationship is satisfied:

$$5 \times 10^{-18} [sec] < t \cdot \exp(-\epsilon/kT).$$

Or, they are characterized by the fact that the following relationship is satisfied:

$$1.72 \times 10^{-21} [sec] < t \cdot \exp(-\epsilon/kT) < 4.63 \times 10^{-14} [sec].$$

Or, they are characterized by the fact that the following relationship is satisfied:

$$5 \times 10^{-18} [sec] < t \cdot \exp(-\epsilon/kT) < 4.63 \times 10^{-14} [sec].$$

Or, they are characterized by the fact that the following relationship is satisfied:

$$1.72 \times 10^{-21} [sec] < t \cdot \exp(-\epsilon/kT) < 1.09 \times 10^{-15} [sec].$$

Or, they are characterized by the fact that the following relationship is satisfied:

$$5 \times 10^{-18} [sec] < t \cdot \exp(-\epsilon/kT) < 1.09 \times 10^{-15} [sec].$$

They are also characterized by the fact that when the two equations directly above are satisfied, the substrate is glass, and annealing temperature T is below the strain point of said glass substrate. In addition, this invention is characterized by the fact that the annealing time t is 300 seconds or less, and is also characterized by the fact that the annealing time t is 180 seconds or less.

In a method of fabricating thin film transistors using a semiconductor film formed on a substrate, this invention is also characterized by having at a minimum a semiconductor film deposition process in which a semiconductor film is deposited on a substrate, a first annealing process in which said semiconductor film is crystallized by repeatedly performing a process that melt crystallizes a portion of said semiconductor film, and a second annealing process in which rapid thermal annealing is performed on said crystallized semiconductor film. Here, the annealing temperature in the aforementioned second annealing process is expressed by the absolute temperature T [K] and, when the annealing time is t [seconds], annealing temperature T and annealing time t are characterized by the fact that the following relationship is satisfied:

$$1.72 \times 10^{-21} [sec] < t \cdot \exp(-\epsilon/kT)$$

($\epsilon = 3.01$ [eV], $k = 8.617 \times 10^{-5}$ [eV/K]: Boltzmann constant).
Or, they are characterized by the fact that the following relationship is satisfied:

$$5 \times 10^{-18} [sec] < t \cdot \exp(-\epsilon/kT).$$

Or, they are characterized by the fact that the following relationship is satisfied:

$$1.72 \times 10^{-21} [sec] < t \cdot \exp(-\epsilon/kT) < 4.63 \times 10^{-14} [sec].$$

Or, they are characterized by the fact that the following relationship is satisfied:

$$5\times10^{-18}[sec]<t\cdot\exp(-\epsilon/kT)<4.63\times10^{-14}[sec].$$

Or, they are characterized by the fact that the following relationship is satisfied:

$$1.72\times10^{-21}[sec]<t\cdot\exp(-\epsilon/kT)<1.09\times10^{-15}[sec].$$

Or, they are characterized by the fact that the following relationship is satisfied:

$$5\times10^{-18}[sec]<t\cdot\exp(-\epsilon/kT)<1.09\times10^{-15}[sec],$$

They are also characterized by the fact that when the two equations directly above are satisfied, the substrate is glass, and thermal annealing temperature T is below the strain point of said glass substrate. In addition, this invention is characterized by the fact that the annealing time t is 300 seconds or less, and is also characterized by the fact that the annealing time t is 180 seconds or less.

In a method of fabricating thin film transistors using a semiconductor film formed on a substrate, this invention is also characterized by having at a minimum a semiconductor film deposition process in which a semiconductor film is deposited on a substrate, a first annealing process in which said semiconductor film is repeatedly exposed to local laser irradiation, and a second annealing process in which rapid thermal annealing is performed on said laser irradiated semiconductor film. Here, the annealing temperature in the aforementioned second annealing process is expressed by the absolute temperature T [K] and when the annealing time is t [seconds], annealing temperature T and annealing time t are characterized by the fact that the following relationship is satisfied:

$$1.72\times10^{-21}[sec]<t\cdot\exp(-\epsilon/kT)$$

($\epsilon=3.01$ [eV], $k=8.617\times10^{-5}$ [eV/K]: Boltzmann constant).

Or, they are characterized by the fact that the following relationship is satisfied:

$$5\times10^{-18}[sec]<t\cdot\exp(-\epsilon/kT).$$

Or, they are characterized by the fact that the following relationship is satisfied:

$$1.72\times10^{-21}[sec]<t\cdot\exp(-\epsilon/kT)<4.63\times10^{-14}[sec].$$

Or, they are characterized by the fact that the following relationship is satisfied:

$$5\times10^{-18}[sec]<t\cdot\exp(-\epsilon/kT)<4.63\times10^{-14}[sec].$$

Or, they are characterized by the fact that the following relationship is satisfied:

$$1.72\times10^{-21}[sec]<t\cdot\exp(-\epsilon/kT)<1.09\times10^{-15}[sec].$$

Or, they are characterized by the fact that the following relationship is satisfied:

$$5\times10^{-18}[sec]<t\cdot\exp(-\epsilon/kT)<1.09\times10^{-15}[sec].$$

They are also characterized by the fact that when the two equations directly above are satisfied, the substrate is glass, and thermal annealing temperature T is below the strain point of said glass substrate. In addition, this invention is characterized by the fact that the annealing time t is 300 seconds or less, and is also characterized by the fact that the annealing time t is 180 seconds or less.

In a method of fabricating thin film transistors using a semiconductor film formed on a substrate, this invention is also characterized by having at a minimum a semiconductor film deposition process in which a semiconductor film is deposited on a substrate, a first annealing process in which said semiconductor film is repeatedly exposed to local high energy optical irradiation, and a second annealing process in which rapid thermal annealing is performed on said high energy optically irradiated semiconductor film. Here, the annealing temperature in the aforementioned second annealing process is expressed by the absolute temperature T [K] and when the annealing time is t [seconds], annealing temperature T and annealing time t are characterized by the fact that the following relationship is satisfied:

$$1.72\times10^{-21}[sec]<t\cdot\exp(-\epsilon/kT)$$

($\epsilon=3.01$ [eV], $k=8.617\times10^{-5}$ [eV/K]: Boltzmann constant).

Or, they are characterized by the fact that the following relationship is satisfied:

$$5\times10^{-18}[sec]<t\cdot\exp(-\epsilon/kT)$$

Or, they are characterized by the fact that the following relationship is satisfied:

$$1.72\times10^{-21}[sec]<t\cdot\exp(-\epsilon/kT)<4.63\times10^{-14}[sec].$$

Or, they are characterized by the fact that the following relationship is satisfied:

$$5\times10^{-18}[sec]<t\cdot\exp(-\epsilon/kT)<4.63\times10^{-14}[sec].$$

Or, they are characterized by the fact that the following relationship is satisfied:

$$1.72\times10^{-21}[sec]<t\cdot\exp(-\epsilon/kT)<1.09\times10^{-15}[sec].$$

Or, they are characterized by the fact that the following relationship is satisfied:

$$5\times10^{-18}[sec]<t\cdot\exp(-\epsilon/kT)<1.09\times10^{-15}[sec].$$

They are also characterized by the fact that when the two equations directly above are satisfied, the substrate is glass, and thermal annealing temperature T is below the strain point of said glass substrate. In addition, this invention is characterized by the fact that the annealing time t is 300 seconds or less, and is also characterized by the fact that the annealing time t is 180 seconds or less.

In a method of fabricating solar cells using a semiconductor film formed on a substrate, this invention is also characterized by having at a minimum a semiconductor film deposition process in which a semiconductor film is deposited on a substrate, a first annealing process in which said semiconductor film is crystallized by repeatedly performing a process that melt crystallizes a portion of the said semiconductor film, and a second annealing process in which rapid thermal annealing is performed on said crystallized semiconductor film. Here, the annealing temperature in the aforementioned second annealing process is expressed by the absolute temperature T [K] and when the annealing time is t [seconds], annealing temperature T and annealing time t are characterized by the fact that the following relationship is satisfied:

$$1.72 \times 10^{-21}[sec] < t \cdot \exp(-\epsilon/kT)$$

($\epsilon = 3.01$ [eV], $k = 8.617 \times 10^{-5}$ [eV/K]: Boltzmann constant).
Or, they are characterized by the fact that the following relationship is satisfied:

$$5 \times 10^{-18}[sec] < t \cdot \exp(-\epsilon/kT).$$

Or, they are characterized by the fact that the following relationship is satisfied:

$$1.72 \times 10^{-21}[sec] < t \cdot \exp(-\epsilon/kT) < 4.63 \times 10^{-14}[sec].$$

Or, they are characterized by the fact that the following relationship is satisfied:

$$5 \times 10^{-18}[sec] < t \cdot \exp(-\epsilon/kT) < 4.63 \times 10^{-14}[sec].$$

Or, they are characterized by the fact that the following relationship is satisfied:

$$1.72 \times 10^{-21}[sec] < t \cdot \exp(-\epsilon/kT) < 1.09 \times 10^{-15}[sec].$$

Or, they are characterized by the fact that the following relationship is satisfied:

$$5 \times 10^{-18}[sec] < t \cdot \exp(-\epsilon/kT) < 1.09 \times 10^{-15}[sec].$$

They are also characterized by the fact that when the two equations directly above are satisfied, the substrate is glass, and thermal annealing temperature T is below the strain point of said glass substrate. In addition, this invention is characterized by the fact that the annealing time t is 300 seconds or less, and is also characterized by the fact that the annealing time t is 180 seconds or less.

In a method of fabricating solar cells using a semiconductor film formed on a substrate, this invention is also characterized by having at a minimum a semiconductor film deposition process in which a semiconductor film is deposited on a substrate, a first annealing process in which said semiconductor film is repeatedly exposed to local laser irradiation, and a second annealing process in which rapid thermal annealing is performed on said laser irradiated semiconductor film. Here, the annealing temperature in the aforementioned second annealing process is expressed by the absolute temperature T [K] and when the annealing time is t [seconds], annealing temperature T and annealing time t are characterized by the fact that the following relationship is satisfied:

$$1.72 \times 10^{-21}[sec] < t \cdot \exp(-\epsilon/kT)$$

($\epsilon = 3.01$ [eV], $k = 8.617 \times 10^{-5}$ [eV/K]: Boltzmann constant).
Or, they are characterized by the fact that the following relationship is satisfied:

$$5 \times 10^{-18}[sec] < t \cdot \exp(-\epsilon/kT).$$

Or, they are characterized by the fact that the following relationship is satisfied:

$$1.72 \times 10^{-21}[sec] < t \cdot \exp(-\epsilon/kT) < 4.63 \times 10^{-14}[sec].$$

Or, they are characterized by the fact that the following relationship is satisfied:

$$5 \times 10^{-18}[sec] < t \cdot \exp(-\epsilon/kT) < 4.63 \times 10^{-14}[sec].$$

Or, they are characterized by the fact that the following relationship is satisfied:

$$1.72 \times 10^{-21}[sec] < t \cdot \exp(-\epsilon/kT) < 1.09 \times 10^{-15}[sec].$$

Or, they are characterized by the fact that the following relationship is satisfied:

$$5 \times 10^{-18}[sec] < t \cdot \exp(-\epsilon/kT) < 1.09 \times 10^{-15}[sec].$$

They are also characterized by the fact that when the two equations directly above are satisfied, the substrate is glass, and thermal annealing temperature T is below the strain point of said glass substrate. In addition, this invention is characterized by the fact that the annealing time t is 300 seconds or less, and is also characterized by the fact that the annealing time t is 180 seconds or less.

In a method of fabricating solar cells using a semiconductor film formed on a substrate, this invention is also characterized by having at a minimum a semiconductor film deposition process in which a semiconductor film is deposited on a substrate, a first annealing process in which said semiconductor film is repeatedly exposed to local high energy optical irradiation, and a second annealing process in which rapid thermal annealing is performed on said high energy optically irradiated semiconductor film. Here, the annealing temperature in the aforementioned second annealing process is expressed by the absolute temperature T [K] and when the annealing time is t [seconds], annealing temperature T and annealing time t are characterized by the fact that the following relationship is satisfied:

$$1.72 \times 10^{-21}[sec] < t \cdot \exp(-\epsilon/kT)$$

($\epsilon = 3.01$ [eV], $k = 8.617 \times 10^{-5}$ [eV/K]: Boltzmann constant).
Or, they are characterized by the fact that the following relationship is satisfied:

$$5 \times 10^{-18}[sec] < t \cdot \exp(-\epsilon/kT)$$

Or, they are characterized by the fact that the following relationship is satisfied:

$$1.72 \times 10^{-21}[sec] < t \cdot \exp(-\epsilon/kT) < 4.63 \times 10^{-14}[sec].$$

Or, they are characterized by the fact that the following relationship is satisfied:

$$5 \times 10^{-18}[sec] < t \cdot \exp(-\epsilon/kT) < 4.63 \times 10^{-14}[sec].$$

Or, they are characterized by the fact that the following relationship is satisfied:

$$1.72 \times 10^{-21}[sec] < t \cdot \exp(-\epsilon/kT) < 1.09 \times 10^{-15}[sec].$$

Or, they are characterized by the fact that the following relationship is satisfied:

$$5 \times 10^{-18}[sec] < t \cdot \exp(-\epsilon/kT) < 1.09 \times 10^{-15}[sec].$$

They are also characterized by the fact that when the two equations directly above are satisfied, the substrate is glass, and thermal annealing temperature T is below the strain point of said glass substrate. In addition, this invention is characterized by the fact that the annealing time t is 300 seconds or less, and is also characterized by the fact that the annealing time t is 180 seconds or less.

In a method of fabricating solar cells using a semiconductor film formed on a substrate, this invention is also characterized by having at a minimum a process in which a first conductive impurity diffusion source is formed on a substrate, a semiconductor film deposition process in which a semiconductor film is deposited on said first conductive impurity diffusion source, a process in which a second conductive impurity diffusion source is formed on the surface of said semiconductor film, a first annealing process in which said semiconductor film is repeatedly exposed to local laser irradiation, and a second annealing process in which rapid thermal annealing is performed on said laser irradiated semiconductor film. Here, the annealing temperature in the aforementioned second annealing process is expressed by the absolute temperature T [K] and when the annealing time is t [seconds], annealing temperature T and annealing time t are characterized by the fact that the following relationship is satisfied:

$$1.72 \times 10^{-21}[sec] < t \cdot \exp(-\epsilon/kT)$$

($\epsilon=3.01$ [eV], $k=8.617 \times 10^{-5}$ [eV/K]: Boltzmann constant).

Or, they are characterized by the fact that the following relationship is satisfied:

$$5 \times 10^{-18}[sec] < t \cdot \exp(-\epsilon/kT).$$

Or, they are characterized by the fact that the following relationship is satisfied:

$$1.72 \times 10^{-21}[sec] < t \cdot \exp(-\epsilon/kT) < 4.63 \times 10^{-14}[sec].$$

Or, they are characterized by the fact that the following relationship is satisfied:

$$5 \times 10^{-18}[sec] < t \cdot \exp(-\epsilon/kT) < 4.63 \times 10^{-14}[sec].$$

Or, they are characterized by the fact that the following relationship is satisfied:

$$1.72 \times 10^{-21}[sec] < t \cdot \exp(-\epsilon/kT) < 1.09 \times 10^{-15}[sec].$$

Or, they are characterized by the fact that the following relationship is satisfied:

$$5 \times 10^{-18}[sec] < t \cdot \exp(-\epsilon/kT) < 1.09 \times 10^{-15}[sec].$$

In a method of fabricating solar cells using a semiconductor film formed on a substrate, this invention is characterized by having at a minimum a semiconductor film deposition process in which a semiconductor film is deposited, a first annealing process in which said semiconductor film is repeatedly exposed to local laser irradiation, a process in which a second conductive impurity diffusion source is formed on the surface of said laser irradiated semiconductor film, and a second annealing process in which rapid thermal annealing is performed on a semiconductor film on which said second conductive impurity diffusion source is formed. Here, the semiconductor film that is deposited in the aforesaid semiconductor film deposition process is further characterized by being a layered structure comprised of a first conductive semiconductor film and an essentially intrinsic semiconductor film. Here, the annealing temperature in the aforementioned second annealing process is expressed by the absolute temperature T [K] and when the annealing time is t [seconds], annealing temperature T and annealing time t are characterized by the fact that the following relationship is satisfied:

$$1.72 \times 10^{-21}[sec] < t \cdot \exp(-\epsilon/kT)$$

($\epsilon=3.01$ [eV], $k=8.617 \times 10^{-5}$ [eV/K]: Boltzmann constant).

Or, they are characterized by the fact that the following relationship is satisfied:

$$5 \times 10^{-18}[sec] < t \cdot \exp(-\epsilon/kT).$$

Or, they are characterized by the fact that the following relationship is satisfied:

$$1.72 \times 10^{-21}[sec] < t \cdot \exp(-\epsilon/kT) < 4.63 \times 10^{-14}[sec].$$

Or, they are characterized by the fact that the following relationship is satisfied:

$$5 \times 10^{-18}[sec] < t \cdot \exp(-\epsilon/kT) < 4.63 \times 10^{-14}[sec].$$

Or, they are characterized by the fact that the following relationship is satisfied:

$$1.72 \times 10^{-21}[sec] < t \cdot \exp(-\epsilon/kT) < 1.09 \times 10^{-15}[sec].$$

Or, they are characterized by the fact that the following relationship is satisfied:

$$5 \times 10^{-18}[sec] < t \cdot \exp(-\epsilon/kT) < 1.09 \times 10^{-15}[sec].$$

Further, in a method of fabricating solar cells using a semiconductor film formed on a substrate, this invention is also characterized by having at a minimum a process in which a first conductive impurity diffusion source is formed on a substrate, a semiconductor film deposition process in which a semiconductor film is deposited on said first conductive impurity diffusion source, a first annealing process in which said semiconductor film is repeatedly exposed to local laser irradiation, a process in which a second conductive impurity diffusion source is formed on the surface of said laser irradiated semiconductor film and a second annealing process in which rapid thermal annealing is performed on a semiconductor film formed by said second conductive impurity diffusion source. Here, the annealing temperature in the aforementioned second annealing process is expressed by the absolute temperature T [K] and when the annealing time is t [seconds], annealing temperature T and annealing time t are characterized by the fact that the following relationship is satisfied:

$$1.72 \times 10^{-21}[sec] < t \cdot \exp(-\epsilon/kT)$$

($\epsilon=3.01$ [eV], $k=8.617 \times 10^{-5}$ [eV/K]: Boltzmann constant).

Or, they are characterized by the fact that the following relationship is satisfied:

$$5 \times 10^{-18}[sec] < t \cdot \exp(-\epsilon/kT).$$

Or, they are characterized by the fact that the following relationship is satisfied:

$$1.72 \times 10^{-21}[sec] < t \cdot \exp(-\epsilon/kT) < 4.63 \times 10^{-14}[sec].$$

Or, they are characterized by the fact that the following relationship is satisfied:

$$5 \times 10^{-18}[sec] < t \cdot \exp(-\epsilon/kT) < 4.63 \times 10^{-14}[sec].$$

Or, they are characterized by the fact that the following relationship is satisfied:

$$1.72 \times 10^{-21}[sec] < t \cdot \exp(-\epsilon/kT) < 1.09 \times 10^{-15}[sec].$$

Or, they are characterized by the fact that the following relationship is satisfied:

$$5\times10^{-18}[sec]<t\cdot\exp(-\epsilon/kT)<1.09\times10^{-15}[sec].$$

Further, in a method of fabricating solar cells using a semiconductor film formed on a substrate, this invention is also characterized by having at a minimum a semiconductor film deposition process in which a semiconductor film is deposited, a first annealing process in which said semiconductor film is repeatedly exposed to local laser irradiation, a process in which a second conductive semiconductor film is deposited on the surface of said laser irradiated semiconductor film, and a second annealing process in which rapid thermal annealing is performed on a semiconductor film on which said second conductive semiconductor film is deposited. Here, the semiconductor film that is deposited in the aforesaid semiconductor film deposition process is further characterized by being a layered structure comprised of a first conductive semiconductor film and an essentially intrinsic semiconductor film. Here, the annealing temperature in the aforementioned second annealing process is expressed by the absolute temperature T [K] and when the annealing time is t [seconds], annealing temperature T and annealing time t are characterized by the fact that the following relationship is satisfied:

$$1.72\times10^{-21}[sec]<t\cdot\exp(-\epsilon/kT)$$

($\epsilon$=3.01 [eV], k=8.617×10$^{-5}$ [eV/K]: Boltzmann constant).
Or, they are characterized by the fact that the following relationship is satisfied:

$$5\times10^{-18}[sec]<t\cdot\exp(-\epsilon/kT).$$

Or, they are characterized by the fact that the following relationship is satisfied:

$$1.72\times10^{-21}[sec]<t\cdot\exp(-\epsilon/kT)<4.63\times10^{-14}[sec].$$

Or, they are characterized by the fact that the following relationship is satisfied:

$$5\times10^{-18}[sec]<t\cdot\exp(-\epsilon/kT)<4.63\times10^{-14}[sec].$$

Or, they are characterized by the fact that the following relationship is satisfied:

$$1.72\times10^{-21}[sec]<t\cdot\exp(-\epsilon/kT)<1.09\times10^{-15}[sec].$$

Or, they are characterized by the fact that the following relationship is satisfied:

$$5\times10^{-18}[sec]<t\cdot\exp(-\epsilon/kT)<1.09\times10^{-15}[sec].$$

Further, in a method of fabricating solar cells using a semiconductor film formed on a substrate, this invention is also characterized by having at a minimum a process in which a first conductive impurity diffusion source is formed on a substrate, a semiconductor deposition process in which a semiconductor film is deposited on said first conductive impurity diffusion source, a first annealing process in which said semiconductor film is repeatedly exposed to local laser irradiation, a process in which a second conductive semiconductor film is deposited on the surface of said laser irradiated semiconductor film, and a second annealing process in which rapid thermal annealing is performed on the semiconductor film formed by said second conductive semiconductor film. Here, the annealing temperature in the aforementioned second annealing process is expressed by the absolute temperature T [K] and when the annealing time is t [seconds], annealing temperature T and annealing time t are characterized by the fact that the following relationship is satisfied:

$$1.72\times10^{-21}[sec]<t\cdot\exp(-\epsilon/kT)$$

($\epsilon$=3.01 [eV], k=8.617×10$^{-5}$ [eV/K]: Boltzmann constant).
Or, they are characterized by the fact that the following relationship is satisfied:

$$5\times10^{-18}[sec]<t\cdot\exp(-\epsilon/kT).$$

Or, they are characterized by the fact that the following relationship is satisfied:

$$1.72\times10^{-21}[sec]<t\cdot\exp(-\epsilon/kT)<4.63\times10^{-14}[sec].$$

Or, they are characterized by the fact that the following relationship is satisfied:

$$5\times10^{-18}[sec]<t\cdot\exp(-\epsilon/kT)<4.63\times10^{-14}[sec].$$

Or, they are characterized by the fact that the following relationship is satisfied:

$$1.72\times10^{-21}[sec]<t\cdot\exp(-\epsilon/kT)<1.09\times10^{-15}[sec].$$

Or, they are characterized by the fact that the following relationship is satisfied:

$$5\times10^{-18}[sec]<t\cdot\exp(-\epsilon/kT)<1.09\times10^{-15}[sec].$$

Further, in an active matrix liquid crystal device having thin film transistors, this invention is characterized by a substrate manufactured by means of the thin film transistor fabrication method described above.

The fundamental principles and scheme of the present invention are described in detail hereafter, with reference to the drawings.

DETAILED DESCRIPTION OF PREFERRED EMBODIMENTS

Figure 1A:
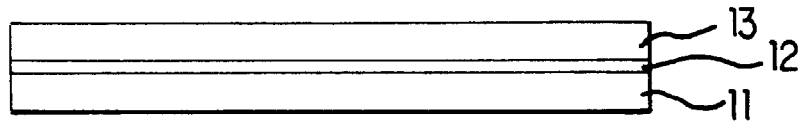
FIGS. 1 (a) through (d) show cross-sectional views of the steps in the TFT fabrication process of the present invention.

1. Fundamental Principles of the Present Invention

In this invention, after a semiconductor film, typically a silicon film, is deposited on a substrate made of glass or other material, a portion of that semiconductor film, the area of said portion being far smaller than the area of the substrate, is repeatedly exposed to laser light or to high energy light (the first annealing step). The energy supplied through laser or energy beam irradiation causes crystallization of the semiconductor layer. If the supplied energy is sufficiently high, after localized melting of the irradiated portion of the semiconductor layer, this portion of the semiconductor layer crystallizes through solidification cooling. (This phenomenon is called melt crystallization in the present invention disclosure.) Conversely, even if the energy supplied is not sufficient to cause melt crystallization, but is higher than a certain level, crystallization may progress in the solid phase within a very short time, usually less than a few seconds. (This very short time solid phase crystallization method is called VST-SPC.) In neither crystallization method, however, is the semiconductor perfectly crystalline at the end of crystallization. In other words, a large number of amorphous components still remain between grains (incomplete crystallization or a low degree of crystallinity), constitutive semiconductor atoms within the grains (Si atoms, for example) are slightly displaced from crystal lattice points (high internal stress and dangling bonds are present in the grains), or the boundaries between grains are irregularly ordered (forming irregular grain boundaries). Incomplete crystallization in which the degree of crystallinity is low is basically caused by a lack of sufficient energy and has a tendency to occur in methods such as VST-SPC. Since in this case an electrically equivalent circuit can be considered as consisting of a crystalline component and an amorphous component connected in series, the electrical characteristics (such as carrier lifetime and mobility) of the amorphous component govern the electrical characteristics of the whole. The larger the incidence of amorphous components, the closer the electrical characteristics are to that of an amorphous material, making the product unsatisfactory as a crystalline semiconductor layer.

The second phenomenon, deviation of atoms from their lattice points, tends to occur readily in melt crystallization upon rapid solidification. In normal melt crystallization achieved by laser irradiation, the duration of the solidification cooling process is at most from about 100 nsec to about 1 $\mu$sec. Hence, in crystallization achieved in such a short period of time, the positions of atoms are fixed even if the atoms have not reached their regular lattice points. In this kind of semiconductor layer, atoms that deviate greatly from regular lattice position have dangling bonds, resulting in the formation of trap states (deep levels) near the middle of the forbidden band in the energy band diagram. On the other hand, even atoms that deviate only slightly from the regular lattice position become potential dangling bonds and form trap states (shallow levels) in the forbidden band near the conduction and valence band edges. Consequently, the electrons and holes in this kind of semiconductor layer that are supposed to be free are trapped in these levels so that the actual carrier (electrons in the conduction band and holes in the valence band) concentration is reduced. Moreover, as a result of scattering by out-of-position atoms, a decrease in characteristics such as mobility is unavoidable.

The third phenomenon, irregular grain boundaries, is frequently observed in both melt crystallization and VST-SPC. Polycrystalline film grain boundaries are chiefly classified as either irregular boundaries, as described above, or as coincidence boundaries. As indicated by the name, an irregular boundary exhibits absolutely no regularity in the grain boundary and has 3-fold coordinated defects (dangling bonds) and 5-fold coordinated defects (floating bonds) as well as precipitates of impurity elements such as oxygen. Consequently, both deep levels and shallow levels form easily and in large numbers in irregular boundaries; and, further, the boundary potential is high. In contrast, coincidence boundaries are comparatively orderly boundaries that have two-dimensional periodicity; dangling bonds are rearranged and groups of 5-member rings and 7-member rings form the boundaries. (As a result, there are few dangling bonds in the boundary.) For this reason, deeps levels are not formed in the forbidden band; and the boundary potential is low. In polycrystalline materials, therefore, among the unavoidable grain boundaries are both good boundaries (coincidence boundaries) and bad boundaries (irregular boundaries). Crystalline layers created by VST-SPC and by melt crystallization employing laser or high energy optical irradiation do not make good films simply because they exhibit to a greater or lesser extent these three problems (incomplete crystallization, deviation from regular lattice points, and irregular grain boundaries). The present invention solves the aforementioned three problems and achieves high quality semiconductor films by employing rapid thermal annealing (RTA) after completion of the first annealing step. (This is the second annealing step).

The second annealing step, typically rapid thermal annealing, and the first annealing step, such as laser irradiation, are similar in that the treated area is sufficiently small compared to the substrate area (in the first annealing step the area of the region that is exposed to laser or high energy optical irradiation is less than about 1% of the total substrate area; in the second annealing step the area of the region that is exposed to RTA irradiation is less than about 5% of the total substrate area). They are also similar in that the annealing time in both is short, well under a few minutes at most (the length of time that a single point on the semiconductor film is continuously exposed at one time ranges from about 10 nsec to about 10 msec in the first anneal and from about 100 msec to about 300 sec in the second anneal). The use of such parameters makes it possible to minimize the thermal stress to which the whole substrate is subjected; and, as a result, allows the use of inexpensive conventional glass substrates. Furthermore, the short period of time required for this process also effectively improves throughput. If in the first annealing step and second annealing step the treated area comprises less than 5% of the substrate area, the distortion of the substrate after two annealings can be limited to a negligible amount, even if the substrate is made of inexpensive conventional glass.

In contrast to the similarities noted above, the second annealing step and first annealing step differ in that the area treated in the second annealing step is larger than the area treated in the first annealing step, the processing time of the second annealing step is longer than the processing time of the first annealing step, and the maximum processing temperature (from approximately 400° C. to 1000° C.) of the second annealing step is lower than the maximum processing temperature (from approximately 1000° C. to 1500° C. or more) of the first annealing step. In the second annealing step, crystallization of the semiconductor film, albeit incomplete, is already finished for the most part. In fact, the amorphous components that remain prior to the second annealing step comprise only very small regions that are surrounded by crystal grains. Therefore, the degree of crystallinity can be improved even under relatively low temperatures. In addition, the reason that such a long time for crystallization in the solid phase is necessary is that the generation of crystal nuclei is slow. The crystal growth rate itself is comparatively fast. During the second annealing step, the crystal surfaces that surround the amorphous components serve as the crystal growth plane. As this crystal growth plane is able to quickly advance during the second annealing, the problem of incomplete crystallization is solved even without requiring the sort of high temperatures used in the first annealing step. In order to solve the aforementioned problem of deviation from the regular lattice points that occurs in the cooling process, the temperature of the second annealing step needs to be lower than the temperature of the first annealing step. As stated above, the problem of internal grain defects and deviation from the regular lattice points (high internal stress) is caused in part by the rapid solidification process. Therefore, this problem is solved by performing annealing slowly and for a long period of time at a temperature lower than that of the first anneal. The reason is that atoms that are deviated from regular lattice points are thermally activated by this kind of heating process and return to the regular lattice points. Further, by processing a larger area during the second anneal than the area processed during the first annealing process, the stresses (large positive and negative values) that differed at each point in the semiconductor film immediately after crystallization are averaged over a wide area, thereby effectively alleviating stress (large positive and negative values become almost zero). Annealing a larger area during the second annealing process than the area annealed during the first annealing process means in effect that local stress at the time of crystallization is uniformly relieved across a broad area. Local stress of this kind can effectively be relieved when the area treated during the second annealing step is about 20 times or more greater than the area treated during the first annealing process. A certain temperature level is necessary to rearrange an irregular boundary and convert it to a coincidence boundary, but the present invention solves this problem by means of a comparatively long second anneal. In addition, the microcrystalline grains that were formed at the time of the first anneal are recrystallized during the second anneal and develop into larger grains. If the number of microcrystalline grains is reduced, the overall total area of grain boundaries is also reduced, and that alone eliminates the adverse effects of the crystalline boundaries. As described, in the present invention, the second anneal, which uses RAT, solves the various problems with crystalline layers created in the first anneal, and high quality semiconductor films can be obtained.

2. From the Substrate to Semiconductor Layer Deposition

Essential components of the present invention from the substrate and underlevel protection layer to the deposition of the semiconductor layer will be explained. For the present invention, substrates including conductive materials such as metals; ceramic materials such as silicon carbide (SiC), alumina ($Al_2O_3$), and aluminum nitride (AlN); transparent or non-transparent insulating materials such as fused quartz and glass; and semiconductor materials such as silicon wafers or silicon wafers that have been processed into LSI can be used. The semiconductor layer is deposited directly on top of the substrate or via an underlevel protection layer or lower electrode. Insulating materials such as silicon oxide ($SiO_x$: $0<x\leq2$) or silicon nitride ($Si_3N_x$: $0<x\leq4$) can be given as examples of underlevel protection layers. When control of impurity migration into the semiconductor layer is important, as when TFTs or other thin film semiconductor devices are being formed on top of normal glass substrates, it is desirable to deposit the semiconductor film after the formation of an insulating underlevel protection layer to avoid penetration of mobile ions like sodium (Na), which are contained in the glass substrate, into the semiconductor film. The same reasoning also holds when using any type of ceramic material as a substrate. The underlevel protection layer prevents impurities, such as sintering aids added to the ceramics, from diffusing or penetrating into the semiconductor regions. When using conductive materials such as metals as substrates, or when a semiconductor layer must be electrically insulated from a metal substrate, an underlevel protection layer is absolutely essential to maintain the insulating properties. Further, when forming semiconductor layers on top of semiconductor substrates or LSI elements, interlevel insulator films between transistors or between interconnects also act as underlevel protection layers.

After the substrate has been cleaned using deionized water and organic solvents such as alcohol, an underlevel protection layer is formed on the substrate by a CVD method such as atmospheric pressure chemical vapor deposition (APCVD), low pressure chemical vapor deposition (LPCVD), or plasma-enhanced chemical vapor deposition (PECVD); or by a method such as sputtering. When using a silicon oxide film as the underlevel protection layer, it can be deposited by atmospheric pressure chemical vapor deposition using monosilane ($SiH_4$) and oxygen as source gases at a substrate temperature of approximately 250° C. to 450° C. With plasma-enhanced chemical vapor deposition and sputtering, the substrate temperatures are between room temperature and approximately 400° C. It is necessary to have a sufficiently thick underlevel protection layer to prevent the diffusion and penetration of impurity elements from the substrate into the semiconductor device, and this thickness is on the order of 1000 angstroms or above as a minimum. Considering variations from lot to lot or from wafer to wafer within a single lot, it is better to have a thickness greater than 2000 angstroms; and, if the thickness is 3000 angstroms, the film can function sufficiently as a protection layer. When the underlevel protection layer also serves as an interlevel insulator layer between IC elements or the interconnects connecting such elements, a thickness of from 4000 to 6000 angstroms is common. If the thickness of the insulating layer is too thick, cracks can appear as a result of stress in the insulating layer. As a result, a maximum film thickness of about 2 $\mu$m is desirable. When throughput must be a major consideration, the upper limit of insulator film thickness is about 1 $\mu$m.

Next, the semiconductor layer will be explained. In addition to being applicable to group IV elemental semiconductor films such as silicon (Si) and germanium (Ge), the present invention is also applicable to the following semiconductor films: group IV compound semiconductor films such as silicon germanium ($Si_xGe_{1-x}$: 0<x<1), silicon carbide ($Si_xC_{1-x}$: 0<x<1), and germanium carbide ($Ge_xC_{1-x}$: 0<x<1); III–V compound semiconductor films such as gallium arsenide (GaAs), and indium antimonide (InSb); and II–VI compound semiconductor films such as cadmium selenide (CdSe). The present invention may also be applicable to higher compound semiconductor films such as silicon germanium gallium arsenide ($Si_xGe_yGa_zAs_z$: x+y+z=1) as well as N-type semiconductor films in which donor elements such as phosphorous (P), arsenic (As), or antimony (Sb) have been added and P-type semiconductors in which acceptor elements such as boron (B), aluminum (Al), gallium (Ga), and indium (In) have been added. These semiconductor layers are formed by CVD methods such as APCVD, LPCVD, and PECVD or by PVD methods such as sputtering or evaporation. When using silicon as the semiconductor layer, deposition by LPCVD at a substrate temperature between approximately 400° C. and 700° C. using a gas such as disilane ($Si_2H_6$) as the source material is possible. With PECVD, deposition with a substrate temperature between approximately 100° C. and 500° C. using a gas such as monosilane ($SiH_4$) as the source material is possible. When using sputtering, the substrate temperature is between room temperature and approximately 400° C. Although the initial condition (as-deposited condition) of semiconductor films deposited by these methods may vary among amorphous, mixed-crystallinity, microcrystalline, or polycrystalline conditions, because the semiconductor layers are crystallized by later steps in the present invention, any of the initial conditions is acceptable. Additionally, in the specifications of the present invention, not only the crystallization of amorphous materials, but also the recrystallization of polycrystalline and microcrystalline materials are all called "crystallization." A semiconductor layer thickness of between approximately 20 nm and approximately 500 nm is suitable when used for TFTs. Depending on the type of laser (for example, a short wavelength laser such as KrF at 248 nm or XeCl at 308 nm) used for melt crystallization by laser annealing in the subsequent first annealing, it may be that only a surface layer of the semiconductor film on the order of 100 nm will crystallize. Crystallization over the entire thickness of a 400 nm or thicker semiconductor layer (especially silicon) even using a relatively long wavelength laser such as HeNe (632.8 nm) is difficult. In the present invention, however, because crystallization of uncrystallized regions can proceed using the second annealing process, thick films on the order of 500 nm, or those of a few $\mu$m (from approximately one to approximately five $\mu$m) as employed in solar cells, can be used. In that sense, it can be said that it is possible to completely crystallize thick semiconductor layers (approximately 200 nm or greater) even using a highly conventional short wavelength (having a wavelength less than or equal to the principal Ar line at 514.5 nm) laser.

3. First Annealing Step

Next, the application of the first annealing process and crystallization method to the semiconductor layer obtained in the previous section will be explained. The exceptionally useful first annealing process in the present invention is performed by a technique such as melt crystallization or VST-SPC of the semiconductor layer with laser or high energy optical irradiation. Here, first the irradiation procedure will be explained using a xenon chloride (XeCl) excimer laser (wavelength of 308 nm) as an example. The laser pulse width at full-width, half maximum intensity (that is, the first annealing process time) is short, from approximately 10 nsec to 500 nsec. Laser irradiation is performed with the substrate between about room temperature (25° C.) and about 400° C. in air, in vacuum with a background pressure of from approximately $10^{-4}$ Torr to approximately $10^{-9}$ Torr, in a reducing environment containing hydrogen or minute amounts of monosilane, or in an inert environment such as helium or argon. A square area of between 5 mm square and 20 mm square (8 mm square, for example) is irradiated during each laser irradiation, and the irradiated region is shifted by between about 1% and 99% after each irradiation (for example 50%: 4 mm in the previous example). At first, after scanning is performed in the horizontal direction (Y direction), the substrate is then shifted a suitable amount in the vertical direction (X direction). It is then moved a fixed distance in the horizontal direction, where it is again scanned. Thereafter these scans are repeated until the entire surface of the substrate has been subjected to the first laser irradiation. For this first laser irradiation, an energy density of between 50 $mJ/cm^2$ and 600 $mJ/cm^2$ is desirable. After the first laser irradiation is completed, a second laser irradiation is performed over the entire surface as necessary. When performing the second laser irradiation, an energy density higher than that of the first irradiation is desirable. A value between about 100 $mJ/cm^2$ and 1000 $mJ/cm^2$ is good. The scanning method used for the second irradiation is identical to that used for the first laser irradiation; scanning is performed while shifting the square irradiation area in appropriate increments in the Y and X directions. Additionally, it is possible to further increase the energy density and perform third and fourth laser irradiations as necessary. It is possible to completely eliminate variations caused by the laser beam edges by using such a multi-stage laser irradiation method. Not only for each irradiation in the multi-stage laser irradiation but even in a normal single stage irradiation, all laser irradiations are performed at energy densities that do not damage the semiconductor film. In addition to the method described above, effecting crystallization by scanning line-shaped laser light having a width of approximately 100 $\mu$m or more and a length of several tens of centimeters is also permissible. In this case, the overlap in the direction of the width of the beam for each irradiation is set to be from about 5% to about 95% of the beam width. If the beam width is 100 $\mu$m and the amount of overlap for each beam is 90%, because the beam advances 10 $\mu$m for every individual irradiation, the same spot receives 10 laser irradiations. Since at least five or more laser irradiations are usually desirable in order to uniformly crystallize a semiconductor film over the entire substrate, a beam overlap for each irradiation of around 80% or higher is required. In order to definitely produce highly crystalline polycrystalline films, it is desirable to control the amount of overlap to be from around 90% to 97% so that the same spot is irradiated from around 10 to 30 times. Although up to this point an XeCl excimer laser has been described as an example of a laser light source, other lasers, including continuous oscillation lasers, may be used provided the laser irradiation time for the same spot of the semiconductor film is within about 10 msec or less and only a portion of the substrate is irradiated. For example, irradiation may also be performed using an ArF excimer laser, XeF excimer laser, KrF excimer laser, YAG laser, carbon dioxide gas laser, Ar laser, dye laser or other type of laser.

Figure 9C:
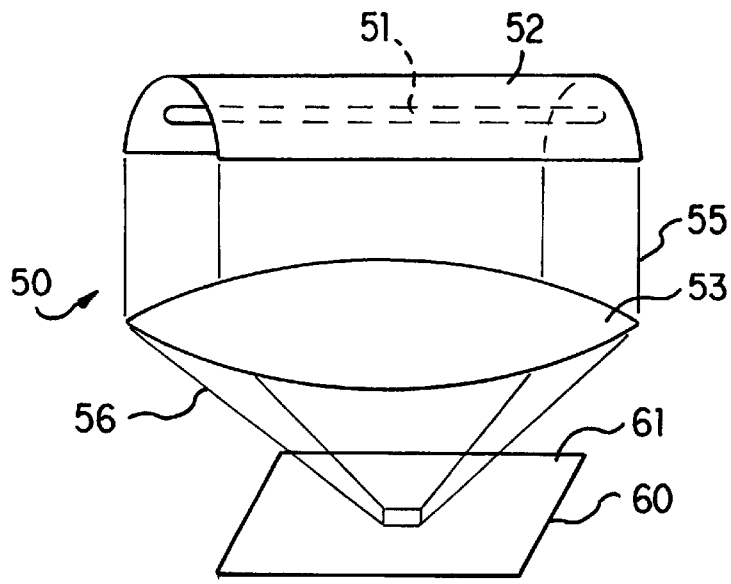
FIGS. 9 (a) through (c) are schematic diagrams of the essential components of the annealing unit used in the first annealing step of the present invention.
Figure 9B:
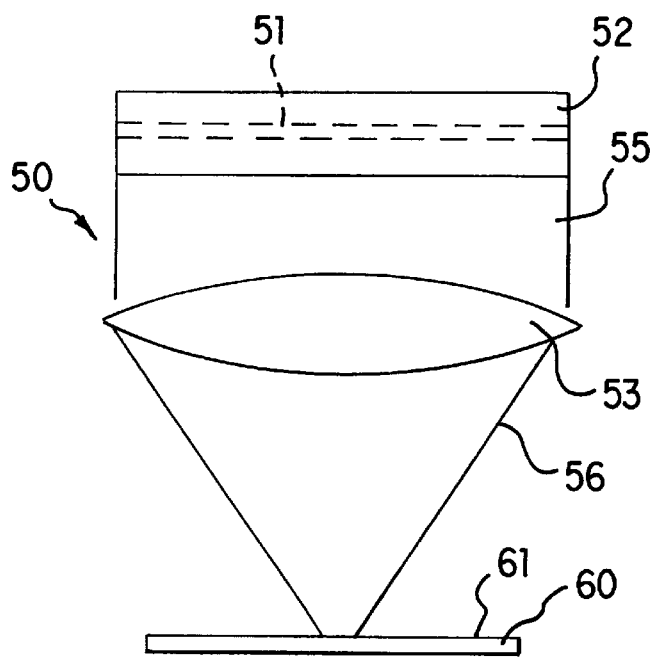
Figure 9C:
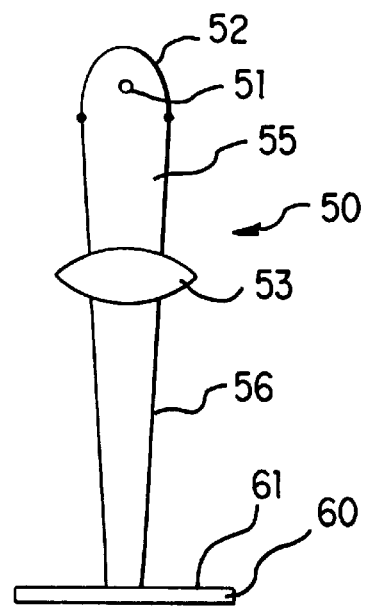
Figure 10A:
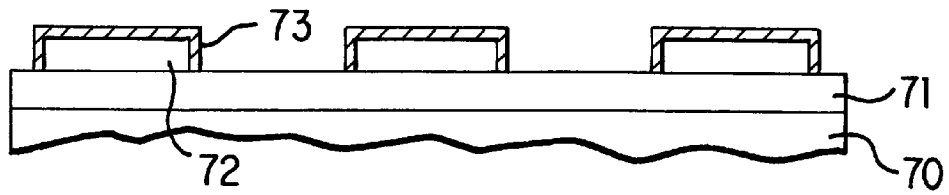
FIGS. 10 (a) through (d) schematically show in cross-section the process steps of one portion of the fabrication procedure for solar cells according to the present invention.
Figure 10B:
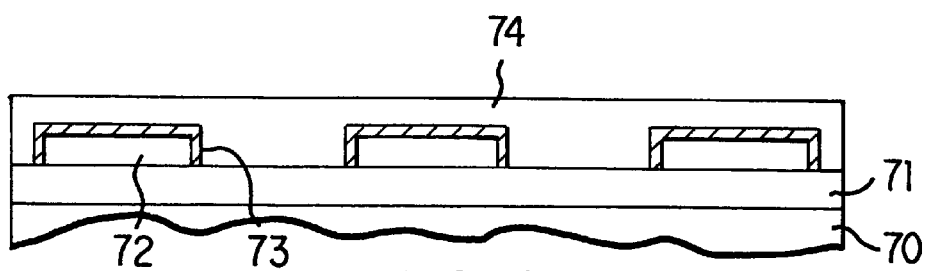
Figure 10C:
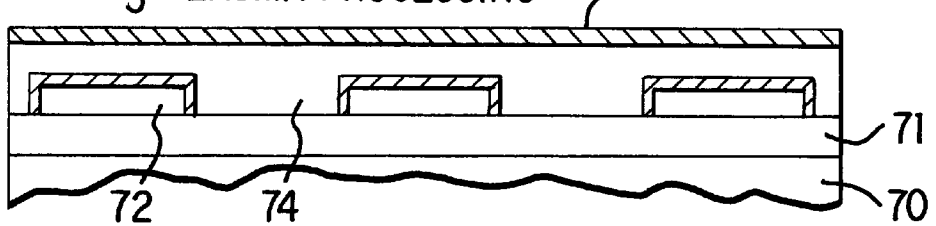
Figure 10D:
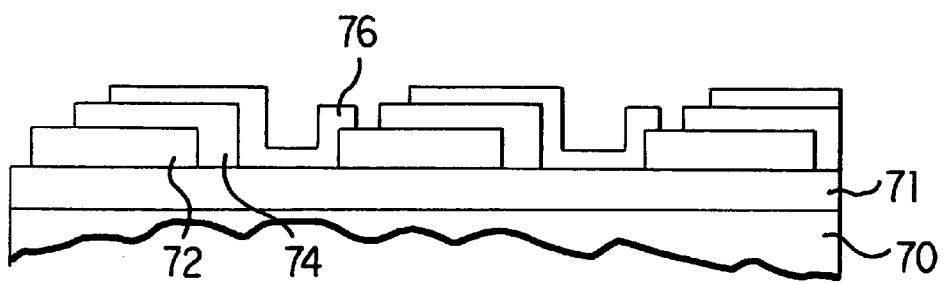

Next, the high energy optical irradiation method will be explained with reference to FIG. 9. Although high energy light does not have uniform phase as in a laser, the optical energy density is increased through focusing by a lens. The deposited semiconductor layer is exposed either consecutively or non-consecutively to repetitive high energy light that is scanned to effect melt crystallization or VST-SPC crystallization of the semiconductor layer. High energy optical irradiation unit 50 is composed of light source 51 such as an arc lamp or tungsten lamp, reflector 52 surrounding the light source, and optical system 53 containing a focusing lens or optical shaping lens and an optical scanning system. The light produced by light source 51 is primarily shaped by reflector 52, and the energy density is increased to produce singly focused light 55. This singly focused light is further modified to increased energy density by means of optical system 53, and simultaneously becomes scanning focused light 56 by means of the scanning function. The light irradiates semiconductor layer 61, which has been formed on top of substrate 60. The processing time for a single point on the semiconductor layer is determined by the length of the irradiation region in the scanning direction and the scanning speed. For example, suppose the irradiation region is rectangular with a length (length in the Y direction) of 50 mm and a width (length in the X direction) of 5 mm, and the scanning speed in the X direction is 500 mm/sec, the processing time is 10 msec. The temperature of the irradiation region is determined by the power input to the light source, the condition of the shaped light, and the processing time. Depending on the semiconductor layer material and the film thickness, these values are suitably controlled and high energy optical irradiation is performed. Although it is desirable to have the processing area be approximately 100 $mm^2$ or higher in order to increase the throughput, in order to keep the thermal effects to the substrate to a minimum, an area of approximately 500 $mm^2$ or less is required. Further, a processing time of less than approximately 10 msec is desirable principally from the point of thermal effects. The result is that only the region on semiconductor layer 61 irradiated by scanned, focus light 56 is locally crystallized. The first annealing step is completed if this process is repeated, and the desired region of the semiconductor layer is scanned.

4. The Rapid Thermal Annealing Unit used in this Invention

The semiconductor layer that has been crystallized by the first annealing process (Section 3) is improved to a superior crystalline semiconductor layer by means of the second annealing process. In order to more effectively realize this improvement, the establishment of appropriate processing conditions for the second annealing step is necessary. In order to explain these in an easily understandable manner, the essentials of the rapid thermal annealing unit used in this invention will first be explained in this section.

Figure 2A:
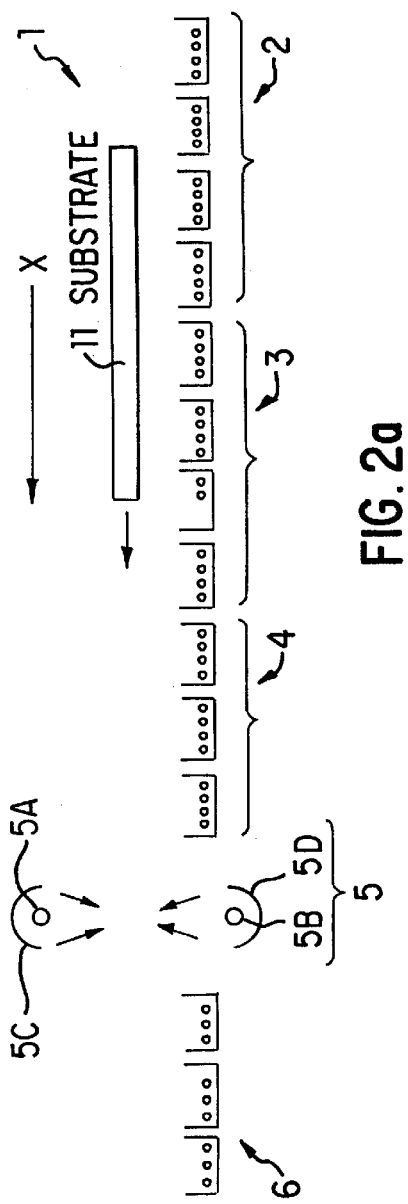
FIG. 2(a) is a schematic diagram showing the essential components of the RTA unit used for the second annealing step in the present invention.
Figure 2C:
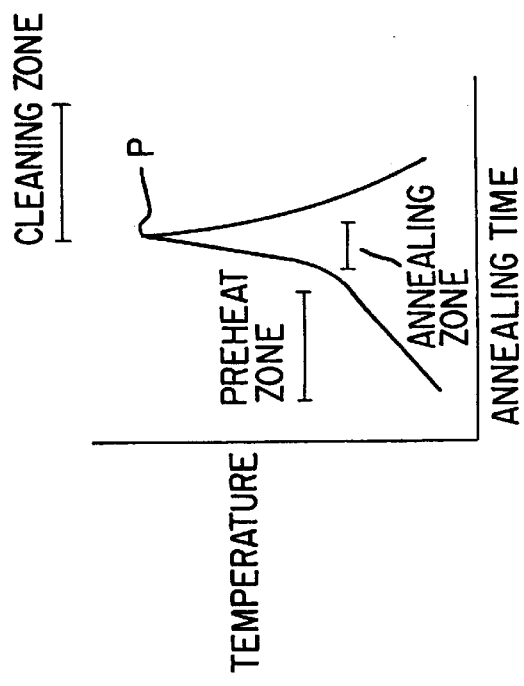
FIG. 2(c) shows the temperature profile in the RTA unit.

FIG. 2(a) is a schematic cross-sectional diagram of the RTA unit used in this invention. Looking from the up-stream side to the down-stream side of the direction of substrate transport (the direction of arrow X), this machine is composed of a 35 cm long first preheat zone 2, a 35 cm long second preheat zone 3, a 25 cm long third preheat zone 4, an annealing zone 5, and a cleaning zone 6. In the first to third preheat zones 2 to 4, and in cleaning zone 6, heaters are located below the substrate transport plane; and the substrate is heated to the desired temperatures. In annealing zone 5, arc lamps 5A and 5B and reflectors 5C and 5D for converging the arc lamp light are arranged above and below in order to irradiate transported substrate 11 with energetic light. The converged arc lamp light takes the shape of a long, narrow band (refer to FIG. 2 (b)). The energetic light irradiation area on substrate 11 has a width of about 10 mm with respect to the direction of substrate travel. Because substrate 11 is transported at a fixed speed, the RTA processing time is determined in accordance with that transport speed. For example, when substrate 11 travels at 15 mm/sec, the RTA processing time is 0.6667 seconds. In this invention disclosure, the expressions "RTA processing time" and "second annealing step process time" are used to mean the time interval during which the RTA light (energetic light) is irradiating the substrate. The RTA annealing temperature is determined by the set point temperatures of the first to third preheat zones, the output of arc lamps 5A and 5B, and the substrate transport speed (that is, the RTA processing time). In this invention disclosure, "RTA processing temperature" and "second annealing step temperature" are used to mean the temperature along edge 5F in energetic light irradiation region 5E. In the RTA unit used in the present invention, this temperature is measured by an infrared pyrometer, and the annealing step is controlled accordingly. This temperature also corresponds to the highest temperature during the RTA process. The temperature profile of a given point on an actual substrate 11 shows the changes as seen in FIG. 2(c). After the substrate being processed passes through the first through third preheat zones 2 to 4, when it enters annealing zone 5 the substrate temperature rises rapidly, and the peak temperature P is attained near the exit of annealing zone 5. This maximum temperature is the RTA processing temperature in this invention disclosure. Following this, the substrate enters cleaning zone 6, and the substrate temperature gradually decreases.

Now, using such an RTA unit, the processing area of the second annealing step is sufficiently small compared to the substrate area. For example, assuming a 300 mm×300 mm square substrate, because the energetic light irradiation region is 10 mm×300 mm (=3000 $mm^2$), the ratio of the annealing area to the substrate area is 3.3%. For a 550 mm×650 mm substrate, the annealing region is 10 mm×550 mm (=5500 $mm^2$); and the annealing area to substrate area ratio is 1.5%. On the other hand, the processing area of the second annealing step is sufficiently large compared to the processing area of the first annealing step. This is because the laser irradiation area is from about 20 $mm^2$ to 400 $mm^2$, and the high energy light irradiation area also is from about 100 $mm^2$ to 500 $mm^2$ as described previously. As a result, the constitution of the present invention described in Section 1 can be realized.

In the RTA unit of the present invention, an arc lamp whose light is easily absorbed by the semiconductor layer is used as the light source. On the other hand, such light is naturally essentially unabsorbed by transparent substrates. As a result, if RTA processing is performed after deposition of a semiconductor layer on a transparent substrate and patterning of the semiconductor layer, the processing temperature from the RTA processing of the semiconductor layer may differ depending on the density of island-shaped semiconductor layer areas. In the present invention, the first and second annealing processes are carried out after deposition of semiconductor layers but before patterning of these semiconductor layers. By so doing, a crystalline semiconductor layer having uniform film quality over the entire substrate surface can be obtained.

5. Thin Film Transistor Fabrication Method

The first point of the present invention is a fabrication method for crystalline semiconductor layers. Yet, it is most convenient to evaluate the quality of the crystalline semiconductor layers through the electrical characteristics of one type of thin film semiconductor device, TFTs, made by using these semiconductor layers. Consequently, the thin film transistor fabrication method according to the present invention is outlined in this Section along with FIG. 1.

The details pertaining to the substrates and underlevel protection layer used in this invention correspond to the explanation in Section 2. Here, a 300 mm×300 mm square, conventional non-alkali glass is used as substrate 11. First, insulating underlevel protection layer 12 is formed on top of substrate 11 by a technique such as atmospheric pressure chemical vapor deposition (APCVD), PECVD, or sputtering. Here, an approximately 200 nm silicon oxide layer is deposited by ECR-PECVD at a substrate temperature of 150° C. Next, a semiconductor layer such as intrinsic silicon, which will later become the active layer of the semiconductor device, is deposited. Formation of the semiconductor layer also follows the explanation of Section 2. The thickness of the semiconductor layer is about 60 nm. In this example, amorphous silicon layer 13 is deposited at a temperature of 425° C. by a high vacuum LPCVD reactor having a 200 sccm flow of disilane ($Si_2H_6$) as the source gas. First, multiple substrates (for example, 17) are inserted facedown in the reaction chamber, which is maintained at 250° C., of the high vacuum LPCVD. After the substrates are inserted, the turbomolecular pump is started. After the pump reaches steady-state speed, the temperature of the interior of the reaction chamber is increased from 250° C. to a deposition temperature of 425° C. over a period of 1 hour. For the first 10 minutes after heating is initiated, no gas is introduced into the reaction chamber and heating is performed in a vacuum. During the remaining 50 minutes of the heating period, nitrogen gas having a purity of at least 99.9999% is continuously introduced at the rate of 300 sccm. The equilibrium pressure in the reaction chamber at this time is $3.0 \times 10^{-3}$ Torr. After the deposition temperature is reached, the source gases, $Si_2H_6$ and 99.9999% pure helium (He) for dilution, are introduced at the flow rates of 200 sccm and 1000 sccm, respectively. The pressure immediately after $Si_2H_6$ and other gases are introduced into the reaction chamber is about 0.85 Torr. As deposition progresses, the reaction chamber pressure gradually rises and the pressure just prior to the completion of deposition is roughly 1.25 Torr. The thickness of silicon film 13 deposited in this way, except for about 7 mm on the periphery of the substrate, varies less than ±5% over a 286 mm square region.

Semiconductor layers obtained in such a fashion are next subjected to the first annealing process. The details of the first annealing process conform to Section 3. In this example, irradiation is performed using a xenon chloride (XeCl) excimer laser (wavelength: 308 nm). The laser pulse width at full-width, half maximum intensity is 45 nsec. Laser irradiation is performed with substrate 11 at room temperature (25° C.) in an inert gas environment (99.999% Ar at 1 atmosphere). The irradiation area for each irradiation is an 8 mm square, the irradiation region is shifted by 4 mm after each irradiation, and the vertical and horizontal scanning is repeated. The energy density of the first laser irradiation is 160 $mJ/cm^2$. Using a similar irradiation method, a second laser irradiation is performed; and the first annealing process is completed. The energy density of the second laser irradiation is 270 $mJ/cm^2$.

After the first annealing process is completed, the second annealing process of the semiconductor layer is performed. The second annealing step is carried out using the RTA unit explained in Section 4, and the optimum processing conditions are described in the following sections. In such a fashion, polycrystalline semiconductor layer (polycrystalline silicon layer) 13 is formed on glass substrate 11 (FIG. 1(a)).

Next, this semiconductor layer is patterned using photolithography technology; and channel region semiconductor layer 13, which later becomes the active layer of the transistor, is formed. After formation of the semiconductor layer, gate insulator layer 14 is formed by a method such as CVD or PVD (FIG. 1(b)). Several methods can be considered for the fabrication of insulating films, but a fabrication temperature of 350° C. or less is desirable. This is essential to avoid thermal degradation of the MOS interface and the gate insulator film. This is applicable to subsequent steps in the fabrication process as well. It is desirable to keep processing temperatures following fabrication of the gate insulator layer at or below 350° C. Doing so allows high performance semiconductor devices to be produced both easily and reliably. In this example, an approximately 120 nm silicon oxide layer is deposited by ECR-PECVD at a substrate temperature of 100° C.

Next, a thin film, which will become gate electrode 15, is deposited by a method such as PVD or CVD. Since the same material is usually used for both the gate electrode and the gate interconnects, and both are fabricated in the same step, it is desirable to use a material that has low electrical resistance and is stable with respect to thermal processing around 350° C. In this example, a tantalum thin film is deposited to a thickness of 600 nm by means of sputtering. The substrate temperature during sputtering is 180° C., and argon containing 6.7% nitrogen was used as the sputtering gas. The tantalum film obtained under these conditions is mostly α-Ta with a resistivity of 40 $\mu\Omega$-cm. After deposition of the thin film for the gate electrode, patterning and then ion implantation into the semiconductor layer is employed to form the source and drain regions 16 and the channel region 17 (FIG. 1(c)). During this process, the gate electrode acts as a mask for ion implantation so that the channel is formed only underneath the gate in a self-aligned structure. For impurity ion incorporation, both ion doping, in which non-mass separation equipment is used and hydrogenated impurity species as well as hydrogen are incorporated into the film, and ion implantation, in which mass-separation ion implanters are used and only the desired impurities themselves are incorporated into the film, are applicable. Source gases for ion doping use hydrogenated species of the impurity ions such as phosphine ($PH_3$) and diborane ($B_2H_6$), which are diluted in hydrogen to concentrations of about 0.1% to 10%. In the case of ion implantation, hydrogen ions (protons or molecular hydrogen ions) are implanted following the implantation of the desired impurity elements by themselves. As mentioned previously, in order to maintain a stable MOS interface and gate insulator layer, it is desirable to keep the temperature at or below 350° C. for both ion doping and ion implantation. On the other hand, in order to always reliably carry out the impurity activation at a low temperature of 350° C. or less (referred to as low temperature activation in the present disclosure), it is desirable to keep the substrate temperature above 200° C. during implantation. To ensure a low temperature activation of impurity ions implanted in the channel to control the transistor threshold voltage or impurity ions implanted in lightly doped regions such as those used to form an LDD structure, it is necessary to keep the substrate temperature at or above 250° C. during ion implantation. The result is that amorphization of the ion implanted region can be avoided by performing the ion implantation at such a high substrate temperature since recrystallization occurs simultaneously with damage to the semiconductor layer. In other words, the ion implanted region remains crystalline following implantation, and the subsequent activation of the implanted ions can still be achieved even using a low activation annealing temperature of less than about 350° C. When fabricating a CMOS TFT, the NMOS or PMOS region is alternately covered by a suitable mask material such as a polyimide, and ion implantation in the appropriate region is performed using the above procedure. In this example, the aim is NMOS formation. Using an ion doping machine, phosphine ($PH_3$) diluted in hydrogen to a concentration of 5% is implanted at an accelerating voltage of 100 keV. The total implanted ion concentration including ions such as $PH_3^+$ and $H_2^+$ is $1\times10^{-16}$ cm$^{-2}$.

Next, interlevel insulator film 18 is formed by either CVD or PVD. In this example, the interlevel insulator layer is deposited to a thickness of 500 nm at a substrate surface temperature of 300° C. using TEOS (Si—(O—$CH_2$—$CH_3$)$_4$), oxygen ($O_2$) and water ($H_2O$) as source gases and argon as a dilution gas. Following ion implantation and interlevel insulator film formation, ion activation and interlevel insulator film densification are carried out by thermal annealing in a suitable thermal environment at temperatures less than about 350° C. for a time ranging from several tens of minutes to a few hours. It is desirable for this annealing temperature to be greater than approximately 250° C. to ensure activation of the implanted ions. Additionally, for effective densification of the interlevel insulator film, a temperature of 300° C. or higher is preferred. Normally, the film quality of the gate insulator layer and the interlevel insulator layer are different. Accordingly, during the opening of contact holes in the two insulator films following interlevel insulator film formation, it is common for the etching rates in the two films to be different. Under such conditions, an inverse taper in which the bottom of the contact hole is wider than the top or the formation of a canopy can result. During electrode formation, these undesirable structures can be causes of poor contact between the electrode and underlying layers in the device leading to so-called "contact failure." The generation of contact failure can be minimized by effective densification of the interlevel insulator film. In this example, annealing was performed for one hour at 300° C. in an oxygen environment containing water vapor with a dew point of 80° C. Compared to simple annealing, annealing at the temperature of from about 100 Åé to about 400 Åé for about 30 minutes to six hours in an oxygen-containing gas (an oxygen concentration of about 25% to 100% is desirable) having a water vapor dew point of from about 35° C. to about 100° C. at a pressure of from roughly 0.5 atmospheres to 1.5 atmospheres promotes improvements in oxide layer (underlevel protection layer, gate insulator layer, interlevel insulator layer, etc.) quality and makes possible highly reliable transistors that operate reliably even under high voltages and high currents. Following formation of the interlevel insulator layer, contact holes 19 are opened above the source and drain regions; and source and drain electrodes 10 and interconnects are formed by PVD or CVD to complete the fabrication of the thin film semiconductor device (FIG. 1(d)).

6. Relationship between Second Annealing Process Conditions and Mobility

In this section, the optimum processing conditions in the second annealing step for obtaining a superior semiconductor layer will be explained through the evaluation (using mobility) of TFTs fabricated by the process described in Section 5. Here, keeping conditions such as the semiconductor layer deposition conditions and the conditions of the first annealing step constant as described earlier, and using only the RTA processing conditions of the second annealing step as parameters, the relationship to the electrical characteristics (mobility) of the semiconductor layer is expressed. The mobilities were obtained from the TFT electrical characteristics using the method of Levinson (J. L. Levinson et al., J. Appl. Phys. 53, 1193, (1983)).

When performing the second annealing step, the heater in first preheat zone 2 in the RTA unit (FIG. 2, 1) was set to an appropriate temperature between 250° C. and 550° C., the heater in the second preheat zone 3 was set to an appropriate temperature between 350° C. and 650° C., and the heater in the third preheat zone 4 was set to a suitable temperature between 450° C. and 750° C. The transport speed of substrate 11 was varied from 2 mm/sec to 50 mm/sec, which resulted in the RTA processing time varying in the range of 0.2 seconds to 5 seconds. Additionally, the output power values of the upper arc lamp 5A and the lower arc lamp 5B were independently controlled from 3 W to 21 W. The result was that the RTA processing temperature (substrate temperature measured in annealing zone 5 (the temperature at edge 5F in lamp irradiation region 5E) by an infrared pyrometer) varied from 433° C. to 906° C., and the second annealing process of the semiconductor layer was performed under these various processing conditions. Again, TFTs were subsequently fabricated following the method described in the previous section and the mobilities measured. The results are shown in Table 1.

TABLE 1

| Sample | Preheating Condition, °C. | Annealing Time, second | Lamp Output W | RTA Temperature, °C. | Mobility, cm2/V-sec | Time Factor, β, second |
| --- | --- | --- | --- | --- | --- | --- |
| 1 | 550, 650, 750 | 0.6667 | 5, 6 | 471 | 48 | $2.74 \times 10^{-21}$ |
| 2 | 550, 650, 750 | 0.6667 | 8, 8 | 541 | 54 | $1.55 \times 10^{-19}$ |
| 3 | 550, 650, 750 | 0.6667 | 10, 11 | 611 | 80 | $4.63 \times 10^{-18}$ |
| 4 | 550, 650, 750 | 0.6667 | 13, 13 | 681 | 110 | $8.41 \times 10^{-17}$ |
| 5 | 550, 650, 750 | 0.6667 | 16, 16 | 766 | 132 | $1.68 \times 10^{-15}$ |
| 6 | 550, 650, 750 | 0.6667 | 18, 19 | 836 | 129 | $1.40 \times 10^{-14}$ |
| 7 | 550, 650, 750 | 0.6667 | 21, 21 | 906 | 140 | $9.09 \times 10^{-14}$ |
| 8 | 550, 650, | 0.2 | 11, 12 | 476 | 43 | $1.12 \times 10^{-21}$ |

TABLE 1-continued

| Sample | Preheating Condition, °C. | Annealing Time, second | Lamp Output W | RTA Temperature, °C. | Mobility, cm2/V-sec | Time Factor, β, second |
|---|---|---|---|---|---|---|
| 9 | 750 250, 350, 450 | 5.0 | 3, 3 | 433 | 45 | $1.64 \times 10^{-21}$ |
| 10 | 550, 650, 750 | 0.2 | 20, 20 | 714 | 101 | $8.58 \times 10^{-17}$ |
| 11 | 250, 350, 450 | 5.0 | 10, 10 | 630 | 104 | $7.98 \times 10^{-17}$ |
| 12 | 550, 650, 750 | 1.0 | 14, 14 | 829 | 132 | $1.72 \times 10^{-14}$ |

The numbers in the Preheat Conditions column of Table 1 are the heater temperature for the first preheat zone, the heater temperature for the second preheat zone, and the heater temperature for the third preheat zone, respectively. Also, in the Lamp Output column are recorded the lower arc lamp 5B power and the upper arc lamp 5A power, in that order.

As explained in Section 1, the second annealing step has various functions; and all of these can be considered to be microscopic rearrangement of the semiconductor atoms. Because the speed of these rearrangements on the atomic level likely follow Boltzmann statistics, the effects of the second annealing step that appear as macroscopic results can also be expected to be governed by the same statistics. Now, suppose that the speed of the atomic rearrangements resulting from the second annealing process is S and that the rearrangement speed can be expressed according to Boltzmann statistics by the following equation (1).

$$S = S_0 \cdot \exp(-\epsilon/kT) \tag{1}$$

Here, $S_0$ is the speed factor, $\epsilon$ is the activation energy, k is the Boltzmann constant ($K = 8.617 \times 10^{-5}$ eV·K$^{-1}$), and T is the annealing temperature expressed as absolute temperature (K). According to experimental results, the activation energy $\epsilon$ is 3.01 eV. Calling the effect of the second annealing step the "degree of crystallization" C for convenience, the degree of crystallization C can be expressed as the product of the rearrangement speed S and the annealing time t.

$$C = S \cdot t = S_0 \cdot t \cdot \exp(-\epsilon/kT) \tag{2}$$

This equation (2) expresses the relationship between the annealing time t and the annealing temperature T for obtaining the desired effect (appropriate C value) from the second annealing step. The annealing time t necessary to produce a given degree of crystallization C when the annealing temperature is T (K) can be calculated from equation (2) as shown below.

$$t = C/S_0 \cdot \exp(-\epsilon/kT)) \tag{3}$$

$$= (C/S_0) \cdot \exp(-\epsilon/kT) \tag{4}$$

$$= \beta \cdot \exp(\epsilon/kT) \tag{5}$$

Here, $\beta$ ($=C/S_0$) is a time factor proportional to the effect of the second annealing process. In other words, if the $\beta$ value is equivalent, it is possible to obtain an equivalent annealing effect even if there are differences in the annealing temperature T (K) or the annealing time t (seconds). Consequently, when prescribing the processing conditions for the second annealing step, it is possible to representatively supply a $\beta$ value rather than completely specifying the particular annealing temperatures and annealing times in detail. This $\beta$ value can be obtained from experiments using equation (5). Table 1 gives $\beta$ values obtained in this fashion that correspond to the various processing conditions.

Figure 3:
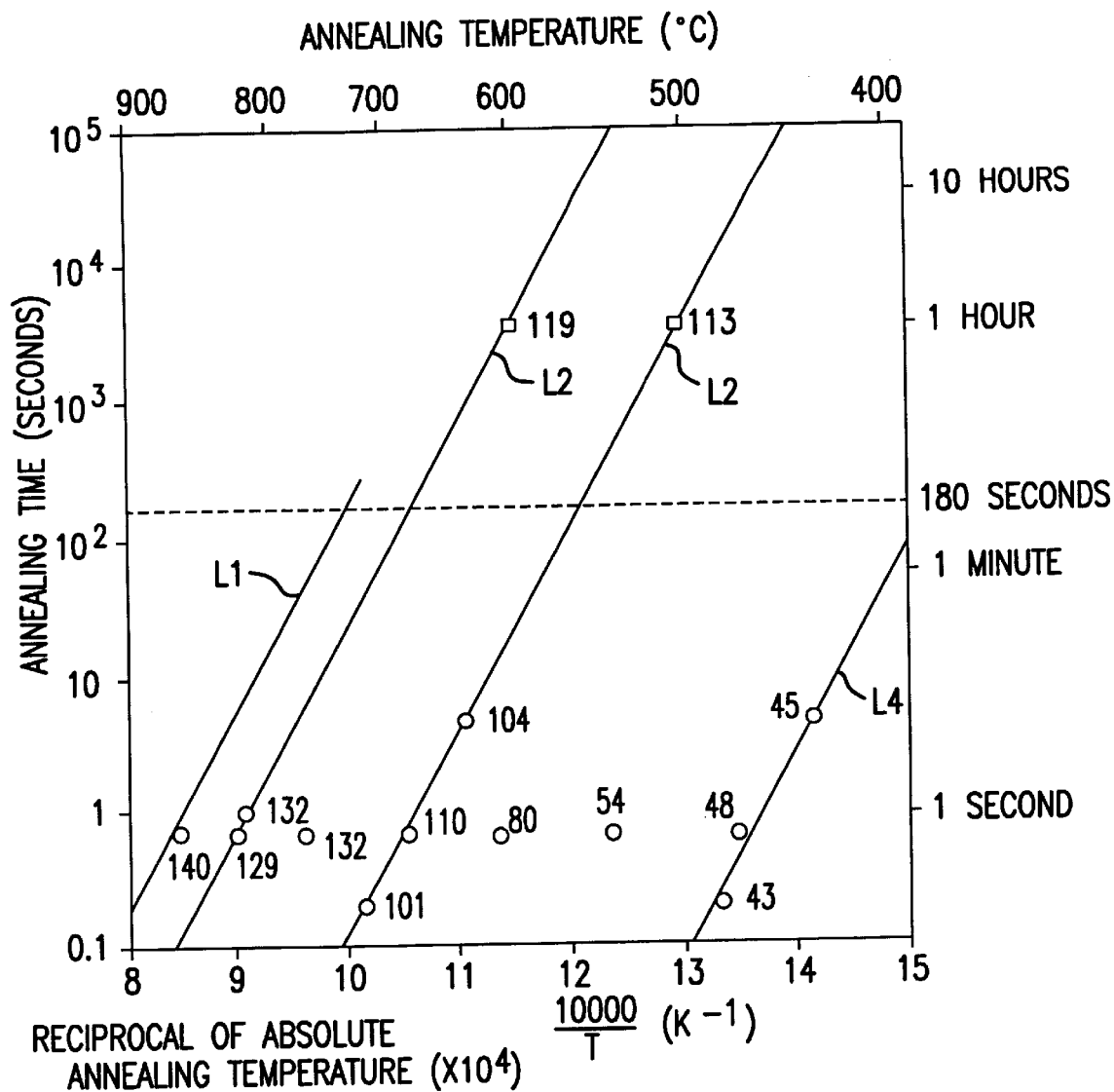
FIG. 3 shows the relationship between the annealing temperature, the annealing time, and the resulting effect (TFT mobility) for the second annealing step in the present invention.

Now, according to equation (5), choosing a coordinate system with the log of the annealing time on the vertical axis and the reciprocal of the annealing temperature on the horizontal axis, a plot of the effect of the second anneal corresponding to the various processing conditions should yield straight lines corresponding to the $\beta$ value. FIG. 3 is a plot of the results of Table 1 following the method above using the mobility as the effect of the second annealing step. In FIG. 3, in addition to the results of Table 1 (circles), the results of data obtained using an annealing furnace (squares) are also shown. The numbers shown in the interior of FIG. 3 are the mobility values obtained for the corresponding processing conditions. Also, the top horizontal axis of FIG. 3 is graduated with the annealing temperatures obtained from equation (5) when the annealing time is fixed at 0.6667 seconds. As predicted by equation (5), points showing equivalent mobilities can be connected with straight lines (lines L1 to L4) proving the validity of the present theory. The effect of the second annealing process is determined entirely by the $\beta$ values.

Figure 4:
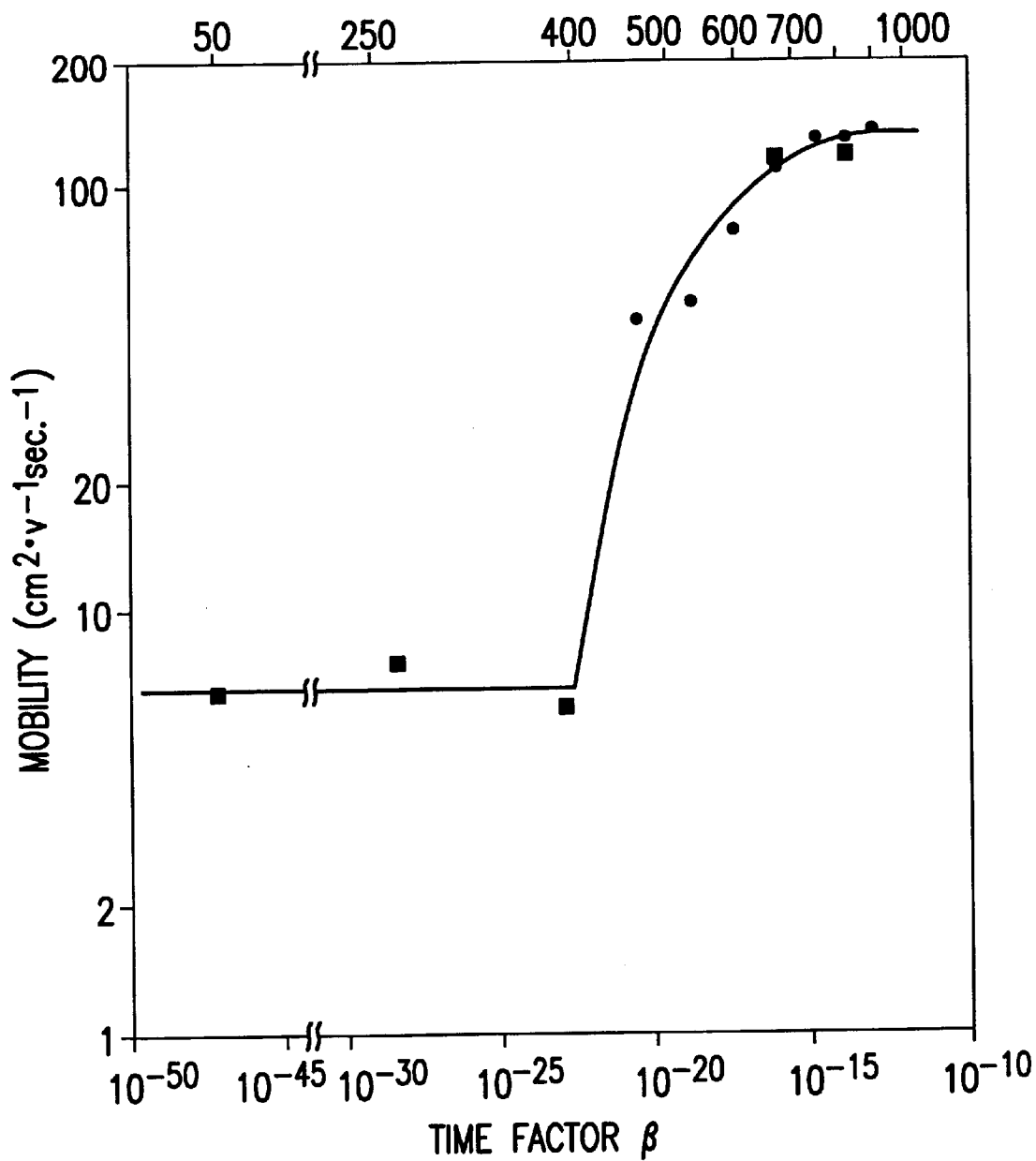
FIG. 4 shows the relationship between the time factor β during the second annealing step in the present invention and the effect (TFT mobility) of the second annealing step.

Next, in order to investigate processing conditions that yield remarkable results for the second annealing process, the relation between the value of the time factor $\beta$ and the mobility was plotted (refer to FIG. 4). In FIG. 4, the mobilities of the semiconductor layers of samples one through seven from Table 1 processed by RTA (circles) and the mobilities of semiconductor layers from samples 13 through 17 from Table 2 in which furnace annealing (squares) was substituted as the means for the second annealing step are plotted together. As can be seen clearly from this figure, second anneal processing becomes effective (a mobility lower limit of 50 cm$^2$/V·sec) for $\beta$ time factors of around $1.72 \times 10^{-21}$ and above. In other words, semiconductor layers that have electron mobilities of 50 cm$^2$/V·sec and higher can be fabricated if the annealing temperature T and the annealing time t are set such that $$\beta = t \cdot \exp(-\epsilon/kT) > 1.72 \times 10^{-21} [sec] \tag{6}$$

is satisfied. For example, when annealing at a temperature of 463° C., an anneal on the order of 0.70 seconds can produce a semiconductor layer with a mobility of approximately 50 cm$^2$/V·sec. The region that satisfies equation (6) corresponds to the region above line L4 in FIG. 3. Additionally, according to Table 1 and FIG. 4, if the second annealing process is done by RTA at conditions in which $\beta$ is on the order of $8.58 \times 10^{-17}$ (for example, 20 seconds at 600° C. or 0.33 seconds at 700° C.) seconds or higher, a semiconductor layer with a mobility of 100 cm$^2$/V·sec or higher can be obtained. The region which satisfies these conditions corresponds to the region above line L3 in FIG. 3.

7. Relationship between Second Annealing Process Conditions and Mobility Nonuniformity There is also a strong relationship between the annealing conditions during the second annealing step and variations in mobility. Table 2 shows the β time factors for samples one through seven from Table 1 and for samples 13 through 17, which were produced using furnace annealing as a substitute for the second annealing step, the average values and standard deviations of mobilities from the crystalline semiconductor layers obtained through these recessing routes, the ratio of the standard deviations to the average values, and converted annealing temperature values corresponding to annealing times of one hour or 0.6667 seconds calculated from the individual β time factors.

tuations of approximately 7% or less can be realized. This is because the principles of the second annealing process presented in Section 1 hold particularly well when the β time factor is above the value given above. Annealing conditions that correspond to these values of the time factor β appear above line L3 in FIG. 3. Specifically, for example, for RTA at 600° C. and 1.18 seconds, the average mobility of semiconductor layers obtained under these conditions is as high as 100 cm$^2$/V·sec.

8. Relationship between Second Annealing Process Conditions and Effects on Substrates From the discussion in Sections 6 and 7, it is known that performing the second annealing step with a large time factor β produces good quality semiconductor layers. If the β value is too large, however, cheap conventional glass substrates will deform from thermal stresses or crack, and cannot be used. In this section, RTA processing conditions that allow for the reliable use of conventional glass substrates will be explained using Table 3.

TABLE 2

| Sample | Time Factor, β, second | Mobility, cm$^2$/V-sec | Standard Deviation, cm$^2$/V-sec | Ratio of Standard Deviation to Mobility | Reduced Temperature, 1h / 0.6667 sec |
|---|---|---|---|---|---|
| 1 | 2.74 × 10$^{-21}$ | 48 | 11.2 | 23.3% | 356° C. / 471° C. |
| 2 | 1.55 × 10$^{-19}$ | 54 | 11.4 | 21.1% | 405° C. / 541° C. |
| 3 | 4.63 × 10$^{-18}$ | 80 | 5.9 | 7.4% | 453° C. / 611° C. |
| 4 | 8.41 × 10$^{-17}$ | 110 | 6.9 | 6.3% | 499° C. / 681° C. |
| 5 | 1.68 × 10$^{-15}$ | 132 | 8.4 | 6.4% | 554° C. / 766° C. |
| 6 | 1.40 × 10$^{-14}$ | 129 | 9.1 | 7.1% | 598° C. / 836° C. |
| 7 | 9.09 × 10$^{-14}$ | 140 | 6.7 | 6.2% | 641° C. / 906° C. |
| 13 | 5.13 × 10$^{-48}$ | 6.4 | 4.8 | 75.0% | 25° C. / 49° C. |
| 14 | 3.28 × 10$^{-29}$ | 7.5 | 4.0 | 53.3% | 200° C. / 262° C. |
| 15 | 1.28 × 10$^{-23}$ | 6.0 | 4.3 | 71.7% | 300° C. / 394° C. |
| 16 | 8.88 × 10$^{-17}$ | 113 | 8.8 | 7.8% | 500° C. / 682° C. |
| 17 | 1.56 × 10$^{-14}$ | 119 | 10.3 | 8.7% | 600° C. / 839° C. |

Figure 5:
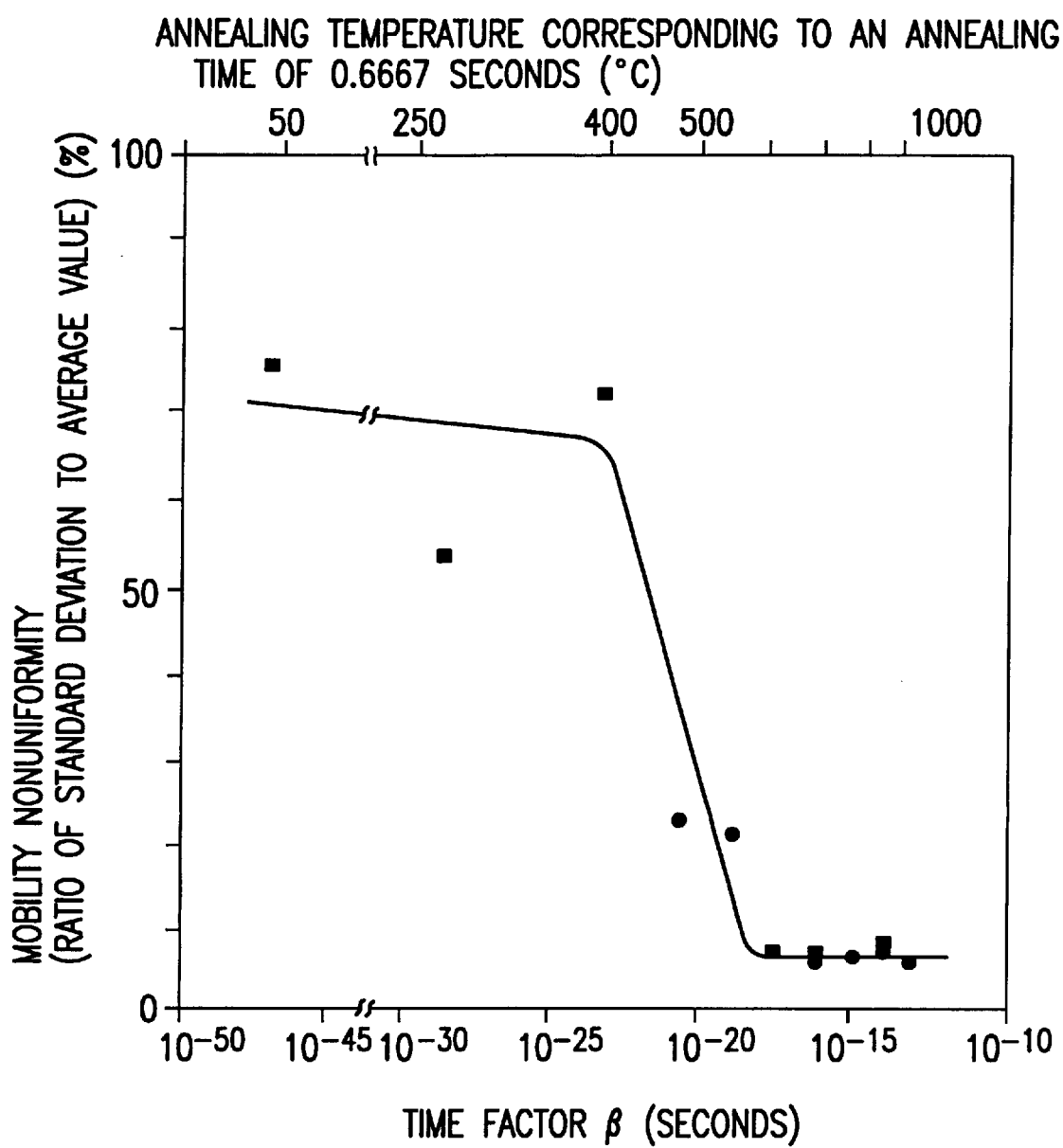
FIG. 5 shows the relationship between the time factor β and the resulting effect (variation in TFT mobility) for the second annealing step in the present invention.

On the other hand, FIG. 5 is a plot of β time factors and mobility nonuniformity (ratio of the standard deviation to the average value) from Table 2. It can be clearly seen that the mobility nonuniformity decreases as β increases. Especially in order to reliably suppress the nonuniformity to 10% or less, it can be seen that a β value on the order of 5.00×10$^{-18}$ seconds or above is sufficient.

$$\beta = t \cdot \exp(-\epsilon/kT) > 5.00 \times 10^{-18} [sec]$$

(7)

In other words, semiconductor layers that have fluctuations in electrical characteristics (for example, mobility) of 10% or less can be obtained with a second annealing process in which the annealing temperature T and the annealing time t are set such that equation (7) is satisfied. Particularly, if the second anneal is carried out by RTA, as done in the present invention, extremely good semiconductor layers with fluc-

TABLE 3

| Sample | Thermal Expansion Coefficient, /°C. | Distortion Point, °C. | Lamp Output W | Heat Treatment Temp., °C. | Time Factor, β, second | Treatable Time, t$_{max}$, sec |
|---|---|---|---|---|---|---|
| A | 46 × 10$^{-7}$ | 593 | 31 | 752 | 1.09 × 10$^{-15}$ | 347 |
| B | 37.8 × 10$^{-7}$ | 667 | 40 | 879 | 4.63 × 10$^{-15}$ | 617 |
| C | 47 × 10$^{-7}$ | 650 | 37 | 836 | 1.43 × 10$^{-15}$ | 378 |
| D | 37 × 10$^{-7}$ | 650 | 38 | 854 | 2.37 × 10$^{-15}$ | 626 |

Table 3 shows the coefficients of thermal expansion and strain points of conventional glass substrates that have recently become common. Table 3 also shows the limiting conditions that can be used without straining each substrate when performing RTA after a first annealing step on semiconductor layers deposited on the substrates. The RTA conditions for each substrate were a first preheat zone temperature of 550° C., a second preheat zone temperature of 650° C., a third preheat zone temperature of 750° C., and an annealing time of 0.6667 seconds. RTA processing was performed under these conditions while varying the lamp output. The maximum lamp output (the sum of the power of the upper arc lamp 5A and the power of the lower arc lamp 5B) without inducing strain, the corresponding annealing temperature, and values of the corresponding β time factors are shown in Table 3. Additionally, from the viewpoint of absolutely avoiding strain in the substrates, Table 3 also shows the possible processing time ($t_{max}$) during annealing determined by the given β time factors at the strain point temperatures for each substrate.

From this table, if the value of the time factor β__is kept at $4.63 \times 10^{-14}$ seconds or less, in other words, if RTA processing is performed with the conditions of annealing temperature T and annealing time t set to satisfy $$\beta = t \cdot \exp(-\epsilon/kT) < 4.63 \times 10^{-14} [sec] \quad (8)$$

it can be seen that it is possible at the least to use substrate B. These conditions correspond to the region below line L1 in FIG. 3. Also, if the value of the time factor β__is kept at $1.09 \times 10^{-15}$ seconds or less, in other words, if RTA processing is performed with the conditions of annealing temperature T and annealing time t set to satisfy $$\beta = t \cdot \exp(-\epsilon/kT) < 1.09 \times 10^{-15} [sec] \quad (9)$$

it is possible to use any of inexpensive glass substrates A to D that are being used in mass production. Since it is likely that improvements in the quality of glass substrates will advance in the future and the thermal resistance will undoubtedly improve over the substrates presently being used, it is to be expected that if the conditions of equation (9) are satisfied, conventional glass substrates can always be used in the scope of the present invention.

Now, when using any type of glass substrates, from the viewpoint of absolutely avoiding strain in the glass substrate, it is desirable to keep the temperature at or below the strain point during annealing. It is possible to completely avoid the deformation of the glass substrates resulting from heat if the temperature is kept at or below the strain point and the time factor is kept at or below the previously mentioned value determined by the strain. For example, when using glass substrate C, there will be no strain if the value of the β time factor is kept at or below approximately $1.43 \times 10^{-14}$ seconds. In order to absolutely completely suppress strain in glass substrate C, it is, however, necessary to perform the second annealing step with an annealing temperature set at or below the strain point of about 650° C. and an annealing time less than or equal to the possible processing time (378 seconds) calculated from the strain point temperature and the β value. In order to apply such consideration to all substrates and taking into account variations in process steps, it can be said that a maximum annealing time of about 300 seconds or less is desirable. For an annealing time of 300 seconds, however, because the RTA beam width is on the order of 10 mm, the substrate speed would be 0.033 mm/sec, with the result being that the processing time for even a relatively small substrate of 235 mm×235 mm would become 7050 seconds (roughly two hours). Consequently, a practical maximum annealing time is probably about 180 seconds at most, and more desirably within about 60 seconds.

Thus, if the second annealing step is performed with the β time factor at or above the lower limit determined by equation (6) or equation (7) and at or below the upper limit determined by equation (8) or equation (9), thus not only can glass substrates withstand thermal stress;, but it is also possible to obtain high quality crystalline semiconductor layers with high mobilities and low nonuniformity. In such a fashion, according to the present invention, while using conventional glass substrates and achieving reductions in cost, the fabrication of thin film transistors with superior operating characteristics and liquid crystal displays employing such transistors or the fabrication of high conversion efficiency solar cells is possible.

As has been explained above, by means of the present invention, high quality crystalline semiconductor layers can be simply produced even using inexpensive conventional glass substrates without subjecting them to By adapting this technology, thin film semiconductor devices such as high performance thin film transistors and solar cells can be fabricated.

BRIEF EXPLANATION OF THE FIGURES

FIGS. 1 (a) through (d) show cross-sectional views of the steps in the TFT fabrication process of the present invention. FIG. 2 (a) is a schematic diagram showing the essential components of the RTA unit used for the second annealing step in the present invention, FIG. 2 (b) explains the annealing state during the second annealing step, and FIG. 2 (c) shows the temperature profile in the RTA unit. FIG. 3 shows the relationship between the annealing temperature, the annealing time, and the resulting effect (TFT mobility) for the second annealing step in the present invention. FIG. 4 shows the relationship between the time factor β during the second annealing step in the present invention and the effect (TFT mobility) of the second annealing step. FIG. 5 shows the relationship between the time factor β and the resulting effect (variation in TFT mobility) for the second annealing step in the present invention. FIGS. 6 (a) through (d) schematically show in cross-section the process steps of one portion of the fabrication procedure for solar cells according to the present invention. FIGS. 7 (a) through (d) schematically show in cross-section the process steps of one portion of the fabrication procedure for solar cells according to the present invention. FIGS. 8 (a) through (d) schematically show in cross-section the process steps of one portion of the fabrication procedure for solar cells according to the present invention. FIGS. 9 (a) through (c) are schematic diagrams of the essential components of the annealing unit used in the first annealing step of the present invention. FIGS. 10 (a) through (d) schematically show in cross-section the process steps of one portion of the fabrication procedure for solar cells according to the present invention.

THE BEST SYSTEMS FOR IMPLEMENTING THIS INVENTION

This invention is explained in further detail with reference to the accompanying figures.

9. Solar Cell Fabrication Procedure

In examples 1 through 4 below, the fabrication procedure for solar cells of this invention are explained. In all the examples, the methods described in sections 1 through 8 can be applied for the semiconductor layer, which forms the active layer of the solar cell.

EXAMPLES

Example 1

The explanation for this example will refer to FIG. 6. First, after an underlevel protection layer is formed on the surface of conventional glass substrate 20 (the underlevel protection layer is not shown in FIG. 6 for simplicity), the substrate-side first electrode (indium tin oxide (ITO) in this example) 21 is formed on top of this underlevel protection layer. This is formed by using photolithography after the deposition of a conducting film by a method such as normal sputtering. Because the present example supposes a solar cell structure in which the light is incident on the semiconductor layer from the substrate side (the bottom side in FIG. 6), transparent glass is used for the substrate and the substrate-side first electrode is also formed from a transparent conducting film. For the opposite structure in which the light incident on the semiconductor layer comes from the element side (the top side in FIG. 6), however, if the element-side second electrode is a transparent conducting film, the materials of the substrate or substrate-side first electrode are not restricted. Next, the surface of substrate-side first electrode 21 is exposed to a plasma that uses diborane ($B_2H_6$), phosphine ($PH_3$) or other gas and the first conductive impurity source 22 for later producing a p-type or n-type semiconductor layer is established. In this example, because the semiconductor layer in contact with the substrate-side first electrode is to be p-type, the surface of substrate-side electrode 21 is exposed to diborane plasma processing and a p-type impurity diffusion source is established (FIG. 6(a)). Specifically, the substrate is immersed in a plasma that contains diborane as one type of source gas and a thin film of boron is formed on the surface of the substrate-side first electrode.

Next, essentially intrinsic semiconductor layer 23 is deposited. Details of the substrate and underlevel protection layer and semiconductor layer conform to Section 2. Here, an intrinsic amorphous silicon film is deposited by PECVD. A semiconductor layer thickness of from about 500 nm to 5 μm is suitable, and the thickness in this example is about 800 nm. Because light is converted to electric signals within this semiconductor layer, an intrinsic semiconductor layer is desirable; but a donor or acceptor impurity level of less than approximately $1\times10^{-18}$ cm$^{-3}$ is acceptable. In the present example, essentially intrinsic means that the impurity level is on this order. Following semiconductor layer deposition, this semiconductor surface is exposed to a plasma containing impurities of the opposite type of the semiconductor layer in contact with the substrate-side first electrode; and second conductive impurity source 24 is established. In this example, because the second conduction type is to be n-type, the semiconductor surface is exposed to a phosphine plasma and n-type impurity diffusion source 24 is established (FIG. 6(b)) The n-type impurity diffusion source is composed of a thin layer of phosphorous. Of course, in contrast to this example, the use of an n-type first conduction type and a p-type second conduction type is also acceptable.

Next, the first annealing step explained in Section 3 is performed. In this example, a multi-stage irradiation using a He—Ne laser (632.8 nm) was performed. For the crystallization of thick semiconductor layers (film thicknesses of about 500 nm to 5 μm) such as those used in solar cells, lasers that have deep penetration of the laser light into the semiconductor layer are suitable. The energy density for the initial laser irradiation is between approximately 100 mJ·cm$^{-2}$ and 150 mJ·cm$^{-2}$. Because the absorption coefficient for a He—Ne laser in amorphous silicon is $4.72\times10^{-3}$ nm$^{-1}$, the laser light penetrates to about 500 nm. In this first laser irradiation, hydrogen is mainly liberated from the surface of the semiconductor layer. The energy density for the second laser irradiation is between approximately 150 mJ·cm$^{-2}$ and 200 mJ·cm$^{-2}$. Although the light penetration depth for this second laser irradiation is of the same order of that for the first irradiation, as a result of the higher energy density, crystallization of the semiconductor surface and the liberation of hydrogen from deeper levels occurs. The energy density for the third laser irradiation is between approximately 200 mJ·cm$^{-2}$ and 250 mJ·cm$^{-2}$. The semiconductor surface is crystallized by the second irradiation, and because the absorption coefficient for a He—Ne laser in polycrystalline silicon decreases to $1.21\times10^{-3}$ nm$^{-1}$, the laser light from the third irradiation is able to penetrate to approximately 800 nm. Although crystallization of the semiconductor layer proceeds down to a depth of roughly several hundred nm as a result of the third irradiation, the entire depth of the semiconductor layer does not crystallize because of the thick semiconductor layer. Additionally, fourth and fifth irradiations are repeated as necessary; and crystallization gradually proceeds to deeper regions. In this process, it is important to select the laser light so that the absorption coefficient for polycrystalline silicon is less than that for amorphous silicon. By so doing, along with the advancement of crystallization, the laser light continues to penetrate to deeper levels. In addition to He—Ne lasers, lasers with wavelengths longer than approximately 350 nm satisfy these conditions. For example, there are lasers such as XeF lasers (351 nm), He—Cd lasers (441.6 nm), Ar principal line lasers (514.5 nm), and Ar secondary line lasers (488 nm). In this example, the first laser irradiation was performed at 125 mJ·cm$^{-2}$, the second laser irradiation was performed at 175 mJ·cm$^{-2}$, and the third and fourth laser irradiations were performed at 225 mJ·cm$^{-2}$ to complete the first annealing step. Next, the second annealing step conforms to Sections 4, 6, 7, and 8. In this example, the second annealing step was performed with conditions of an annealing time of 0.6667 seconds, and an RTA temperature of 681° C. (time factor $\beta=8.41\times10^{-17}$ seconds). Because the semiconductor layer was thick, it was difficult to crystallize the entire layer by the first annealing step; but the semiconductor layer was completely crystallized by this second annealing step. The result is the production of high quality crystallized semiconductor layer 23 as explained in section 1 and, simultaneously, the production of a structure having an intrinsic layer sandwiched between p-type and n-type layers (FIG. 6(c)). The first and second annealing steps do not stop at merely crystallization, but also promote impurity diffusion from the impurity diffusion sources into the intrinsic semiconductor layer. As a result, n-type and p-type semiconductor layers are also created.

Figure 6A:
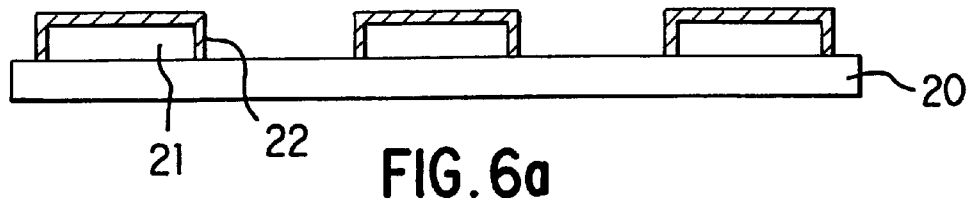
FIGS. 6 (a) through (d) schematically show in cross-section the process steps of one portion of the fabrication procedure for solar cells according to the present invention.
Figure 6B:
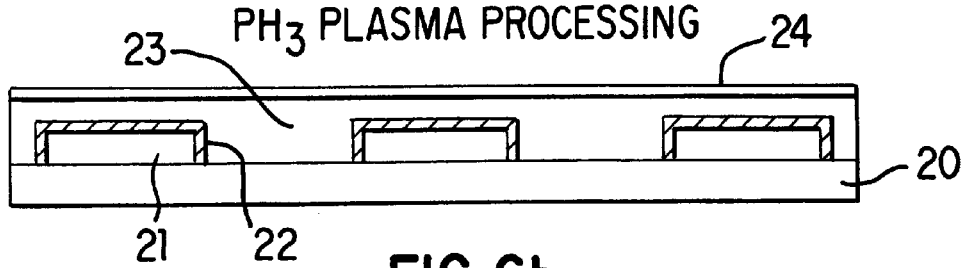
Figure 6C:
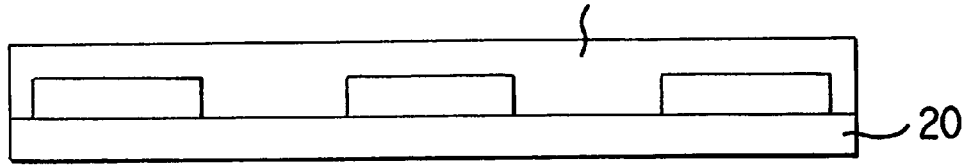
Figure 6D:
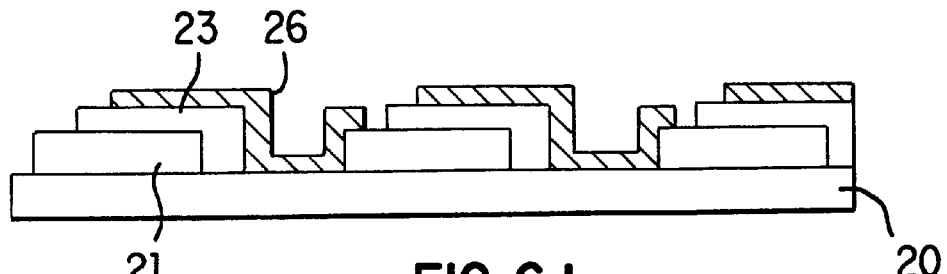

Following this, crystalline semiconductor layer 23 is patterned, element-side second electrode 26 is formed from aluminum or other conducting layer, interconnects are fabricated between elements, and the polycrystalline solar cell is completed (FIG. 6(d)).

Example 2

In Example 1 the formation of the first conductive semiconductor layer and the second conductive semiconductor layer was carried out by impurity diffusion into the intrinsic semiconductor layer, but in this example, impurity containing semiconductor layers are formed by a method such as CVD and solar cells are fabricated (refer to FIG. 7).

Figure 7A:
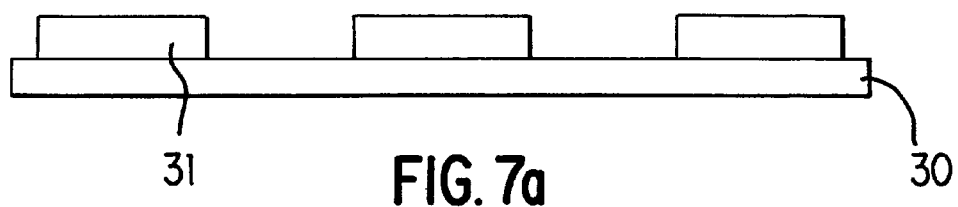
FIGS. 7 (a) through (d) schematically show in cross-section the process steps of one portion of the fabrication procedure for solar cells according to the present invention.
Figure 7B:
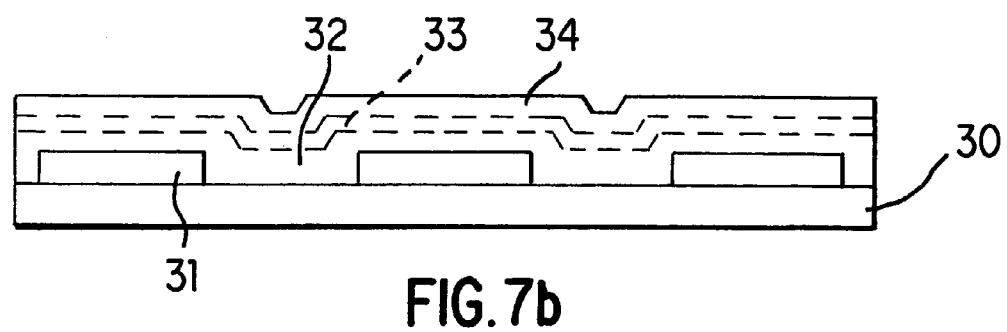
Figure 7C:
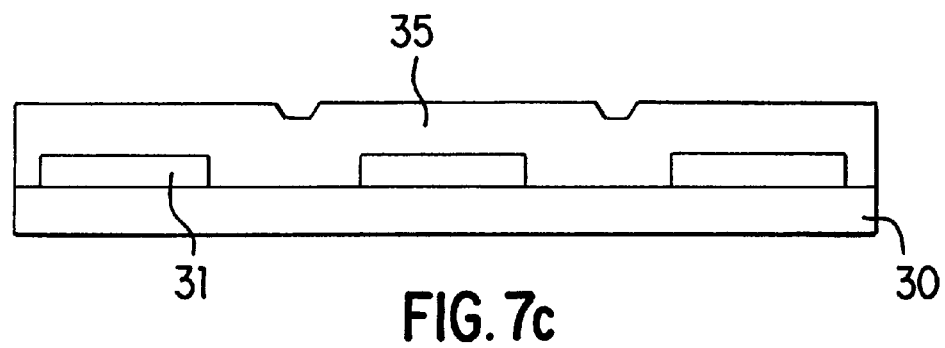
Figure 7D:
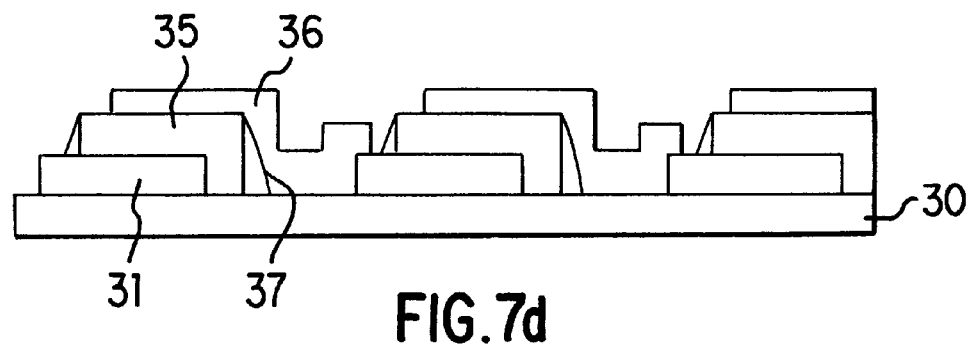
Figure 8A:
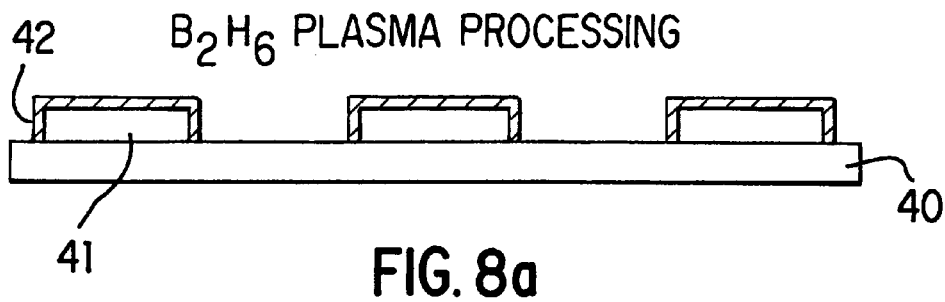
FIGS. 8 (a) through (d) schematically show in cross-section the process steps of one portion of the fabrication procedure for solar cells according to the present invention.
Figure 8B:
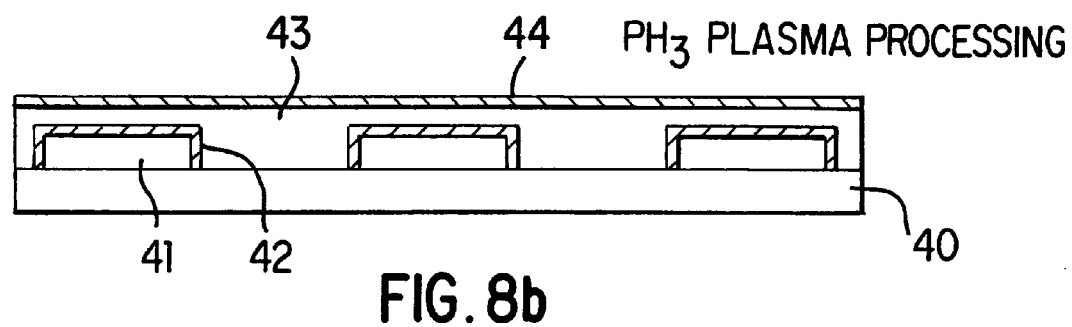
Figure 8C:
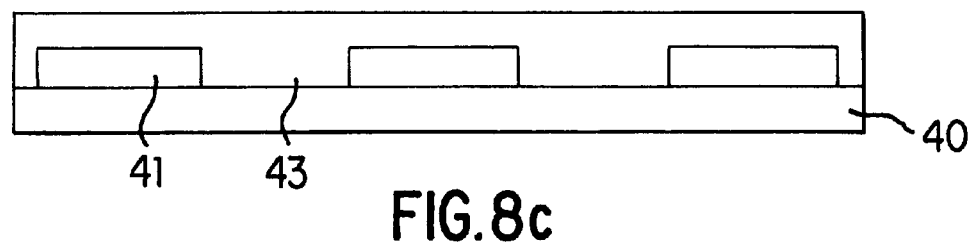
Figure 8D:
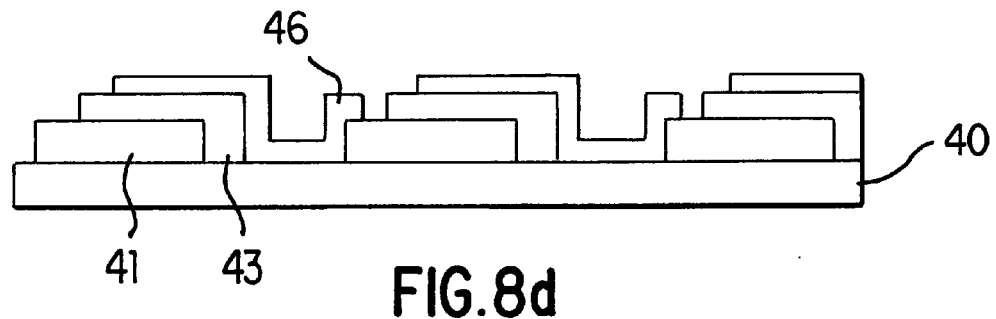

As in Example 1, after an underlevel protection layer is formed on the surface of conventional glass substrate 30 (in FIG. 7 as well, the underlevel protection layer is not shown for the sake of simplicity), substrate-side first electrode (indium tin oxide (ITO) in this example) 31 is formed on top of this underlevel protection layer (FIG. 7(a)). Next, first conductive semiconductor layer 32, essentially intrinsic semiconductor layer 33, and second conductive semiconductor layer 34 are formed in a layered structure on the surface of the substrate-side first electrode by a method such as CVD (FIG. 7(*b*)). In this example, p-type silicon film 32 is deposited to a thickness of about 10 nm by PECVD using diborane and monosilane as source gases to form the first conductive semiconductor layer. Without interruption, intrinsic semiconductor film 33 is grown to a thickness of about 800 nm. At this point, the diborane supply is stopped; and only monosilane is introduced into the CVD reaction chamber. Again without interruption and without breaking vacuum, second conductive semiconductor layer 34 is deposited to about 20 nm. In this example, this corresponds to an n-type film and phosphine and monosilane are introduced into the CVD reaction chamber. When depositing semiconductor films by LPCVD, using higher silanes such as disilane in place of monosilane allows the deposition of semiconductor films at relatively low temperatures.

After this, the first and second annealing steps are performed as in Example 1, and high quality polycrystalline semiconductor layer 35 is fabricated. At this time, the first and second conductive impurities contained within the semiconductor layer are activated, and the result is semiconductor film 35, which is composed of an intrinsic semiconductor layer sandwiched by the first conductive semiconductor layer (p-type in this example) and the second conductive semiconductor layer (n-type in this example) (FIG. 7(*c*)).

Finally, after patterning of semiconductor film 35, element-side second electrode 36 is formed from aluminum or other conducting layer, interconnects are fabricated between elements, and the high performance crystalline solar cell is completed. Prior to fabrication of the element-side second electrode, insulating layer 37 is prepared on the edge face of semiconductor layer 35 as needed in order to reliably prevent electrical shorting, which occurs easily with the formation of element-side second electrode 36. Further, although the first conductive type is p-type and the second conductive type is n-type in the present example, the opposite case in which the first conductive type is n-type and the second conductive type is p-type is also acceptable.

Example 3

While Example 1 showed an example of a solar cell structure in which the light was incident upon the semiconductor layer from the substrate side, this example shows one example of a structure in which the light is incident from the element side (the top side in FIG. 8) in contrast to Example 1 (refer to FIG. 8).

First, after forming an underlevel protection layer as necessary on the surface of substrate 40, which is inexpensive and has relatively good flatness such as might be found with glass, substrate-side first electrode 41 is formed from a material such as aluminum or platinum. As the material for the substrate-side first electrode, a conductive material such as a metal with high light reflectivity and high electrical conductivity is desirable. There are no special limitations on the substrate as long as it is stable with respect to thermal processing steps and chemicals in the fabrication of solar cells. Substrate-side first electrode 41 is formed by photolithography following deposition of such suitable conducting films by methods such as PVD. Next, first conductive impurity diffusion source 42 is formed on the surface of the substrate-side first electrode. In this example, the first conductive type is p-type; and plasma processing using diborane gas is performed. The result is that p-type impurity diffusion source 42 is formed on the surface of the substrate-side first electrode (FIG. 8(*a*)).

Below, the solar cell is fabricated by exactly the same process as in Example 1. That is, after formation of an approximately 800 nm thick essentially intrinsic semiconductor film 43 (amorphous silicon film) using CVD or other method, plasma processing using phosphine gas or other source, second conductive impurity diffusion source 44 is formed on the surface of the semiconductor film (FIG. 8(*b*)). Next, as in Example 1, first and second annealing steps are performed, and semiconductor layer crystallization proceeds along with impurity activation (FIG. 8(*c*)). Finally, after semiconductor layer patterning, the reflective polycrystalline solar cell is fabricated through element interconnection by element-side second electrode 46, which is composed of ITO or other transparent conducting layer (FIG. 8(*d*)).

In the solar cell structure shown in this example, after the light incident from the element side passes through semiconductor layer 43, it is reflected from the substrate-side first electrode and again passes through semiconductor layer 43. As a result, compared to a transparent element, the thickness of the semiconductor layer is effectively doubled. Although the present invention disclosure has demonstrated a crystallization method for thick semiconductor layers, it is not the case that crystallization of thick semiconductor layers on the order of 1 $\mu$m is extremely simple. This is because the required times for the first and second annealing step becomes long, and it may be easy for the semiconductor layer to peel off. Considering this point, because the structure shown in this example can effectively double the semiconductor layer thickness, it is safe to say that the structure is particularly well-suited for solar cells using crystallized semiconductor layers.

Example 4

In the previous examples, an essentially intrinsic semiconductor layer is deposited on the first conductive impurity diffusion source or first conductive semiconductor layer, and first and second annealing is conducted after formation of the second conductive impurity diffusion source or second conductive semiconductor layer is formed. In contrast, in this example, following the deposition of a semiconductor layer that includes at least an essentially intrinsic semiconductor layer, a first annealing process is performed through repeated local laser exposure of these semiconductor layers. Subsequently, a second conductive impurity diffusion source is formed or a second conductive semiconductor layer is deposited on the surface of the semiconductor layer given the first annealing treatment. Finally, a second annealing process consisting of rapid thermal annealing is performed and the solar cell is fabricated.

Specifically, following formation of the substrate-side first electrode, the process moves to the previously mentioned semiconductor layer deposition. Here, the deposited semiconductor layer can be a layered film of the first conductive semiconductor layer and the essentially intrinsic semiconductor layer or the essentially intrinsic semiconductor layer can be deposited after the first conductive impurity diffusion source is formed on top of the substrate-side first electrode. Crystallization of the semiconductor layer proceeds by means of the first annealing process after such formation of the semiconductor layer. At a minimum, the surface of the semiconductor layer is crystallized by the first annealing process; and, depending on the processing conditions, activation of the impurities in the first conductive layer may also occur. Next, the second conductive impurity diffusion source can be formed on the semiconductor layer that was subjected to the first annealing process, or the second conductive semiconductor layer is deposited, after which a second annealing process consisting of rapid thermal annealing is carried out. The implications of the second annealing process in the present example are not only those as described in Section 1, but also the activation in the solid state of the impurities in the second conductive semiconductor layer or the activation in the solid state of those elements in the first conductive semiconductor layer that were insufficiently activated by the first annealing process. Because the first annealing process in the present disclosure is either melt crystallization or laser or high energy optical irradiation of the semiconductor layer, if the second conductive impurities exist on the surface of the essentially intrinsic semiconductor layer, these impurity elements can unfortunately diffuse deep into the intrinsic semiconductor layer as a result of the first annealing process. As a result, especially in the case of melt crystallization, because the second conductive impurity elements can spread throughout the entire molten layer, the thickness of the intrinsic layer that converts light to electrical signals decreases and leads to a decrease in the conversion efficiency of optical energy to electrical energy. In the present example, however, after completion of the first annealing step, the second conductive impurities are prepared on the surface of the intrinsic semiconductor layer, and the impurities are subsequently activated by the second annealing process. Because the temperature of the second annealing process is less than that of the first annealing process and, further, film quality is improved in the solid state, the diffusion of the second conductive impurities is controlled and a shallow junction is formed. In other words, the intrinsic semiconductor layer remains sufficiently thick after the second annealing process so that it is possible to obtain solar cells with high conversion efficiency.

Below, an example is explained with reference to FIG. 10. First, after forming underlevel protection layer 71 as necessary on the surface of substrate 70, which is inexpensive and has relatively good flatness such as might be found with glass, substrate-side first electrode 72 is formed from a material such as aluminum or platinum. As the material for the substrate-side first electrode, a conductive material such as a metal with high light reflectivity and high electrical conductivity is desirable. Substrate-side first electrode 72 is formed by photolithography following deposition of such suitable conducting films by methods such as PVD. Next, first conductive impurity diffusion source 73 is formed on the surface of the substrate-side first electrode. Here, in place of the formation of the first conductive impurity source, the first conductive semiconductor layer is deposited by CVD or other method as shown in Example 2. In this example, the first conductive type is p-type; and plasma processing using diborane gas is performed. The result is that p-type impurity diffusion source 73 is formed on the surface of the substrate-side first electrode (FIG. 10(*a*)).

Next, essentially intrinsic semiconductor layer 74 (amorphous silicon layer) is formed to a thickness of about 800 nm using a method such as CVD. The first annealing step is then performed using the same conditions as in Example 1 (FIG. 10(*b*)). After completion of the first annealing step, the semiconductor layer is exposed to plasma processing using a gas such as phosphine, and the second conductive impurity diffusion source 75 is formed on the surface of the semiconductor layer (FIG. 10(*c*)). Here as well, in place of the formation of the second impurity diffusion source, deposition of the second conductive semiconductor layer using CVD or other method is desirable. Next, as in Example 1, the second annealing process is carried out and the semiconductor layer is further crystallized along with activation of impurities. Finally, after semiconductor layer patterning, the reflective polycrystalline solar cell is fabricated through element interconnection by element-side second electrode 76, which is composed of ITO or other transparent conducting layer (FIG. 10(*d*)).

10. Crystalline Semiconductor Layer Formation and Thin Film Transistor Fabrication In Example 5, an example of the present invention's method of crystalline semiconductor layer formation and a method of thin film transistor fabrication using such a formation method is explained with reference to FIG. 1.

Example 5

An example of the present invention's semiconductor layers and the fabrication procedure for thin film transistors using such layers will be explained. The underlevel protection layer and the semiconductor layer are deposited in a parallel plate electrode PECVD reactor operating at industrial frequency (13.56 MHz). First, after forming an underlevel protection layer, consisting of an insulating material such as a silicon oxide film on at least part of a substrate, a semiconductor film is formed on top of this underlevel protection layer.

A 360 mm×475 mm×1.1 mm glass substrate (OA-2) 11, which is at room temperature, is set in the PECVD reactor, the lower plate electrode of which is maintained at a temperature of 380° C. The recipe followed once the substrate is in place in the PECVD reaction furnace is as follows.

| (Preheat 1) | |
|---|---|
| Time: | t = 60 sec |
| Nitrous oxide flow rate: | $N_2O$ = 7000 SCCM |
| Monosilane flow rate: | $SiH_4$ = 250 SCCM |
| High frequency power: | RF = 0 W (no plasma) |
| Pressure: | P = 3.0 Torr |
| Electrode separation: | S = 23.3 mm |
| Lower plate electrode Temperature: | Tsus = 380° C. |
| (Preheat 2) | |
| Time: | t = 30 sec |
| Nitrous oxide flow rate: | $N_2O$ = 7000 SCCM |
| Monosilane flow rate: | $SiH_4$ = 250 SCCM |
| High frequency power: | RF = 0 W (no plasma) |
| Pressure: | P = 1.5 Torr |
| Electrode separation: | S = 23.3 mm |
| Lower plate electrode temperature: | Tsus = 380° C. |
| (Underlevel Protection Layer Growth) | |
| Time: | t = 60 sec |
| | (growth rate 4.0 nm/sec) |
| Nitrous oxide flow rate: | $N_2O$ = 7000 SCCM |
| Monosilane flow rate: | $SiH_4$ = 250 SCCM |
| High frequency power: | RF = 900 W (0.342 W/cm$^2$) |
| Pressure: | P = 1.5 Torr |
| Electrode separation: | S = 23.3 mm |
| Lower plate electrode temperature: | Tsus = 380° C. |
| (Vacuum 1) | |
| Time: | t = 20 sec |
| (gases not flowing) | |
| High frequency power: | RF = 0 W (no plasma) |
| Pressure: | P = 1 × 10$^{-4}$ Torr |
| Electrode separation: | S = 23.3 mm |
| Lower plate electrode temperature: | Tsus = 380° C. |

(Preheat 1)

(Oxygen Plasma Processing 1)

| | |
|---|---|
| Time: | t = 20 sec |
| Oxygen flow rate: | O$_2$ = 3000 SCCM |
| High frequency power: | RF = 900 W (0.342 W/cm$^2$) |
| Pressure: | P = 1.0 Torr |
| Electrode separation: | S = 23.3 mm |
| Lower plate electrode temperature: | Tsus = 380° C. |

(Vacuum 2)

| | |
|---|---|
| Time: | t = 20 sec |
| (gases not flowing) | |
| High frequency power: | RF = 0 W (no plasma) |
| Pressure: | P = 1 × 10$^{-4}$ Torr |
| Electrode separation: | S = 23.3 mm |
| Lower plate electrode temperature: | Tsus = 380° C. |

(Hydrogen Plasma Processing 1)

| | |
|---|---|
| Time: | t = 20 sec |
| Hydrogen flow rate: | H$_2$ = 100 SCCM |
| Argon flow rate: | Ar = 1500 SCCM |
| High frequency power: | RF = 100 W (0.038 W/cm$^2$) |
| Pressure: | P = 1.5 Torr |
| Electrode separation: | S = 34.3 mm |
| Lower plate electrode temperature: | Tsus = 380° C. |

(Preheat 3)

| | |
|---|---|
| Time: | t = 30 sec |
| Silane flow rate: | SiH$_4$ = 95 SCCM |
| Argon flow rate: | Ar 7000 SCCM |
| | (source concentration 1.34%) |
| High frequency power: | RF = 0 W (no plasma) |
| Pressure: | P = 1.75 Torr |
| Electrode separation: | S = 36.8 mm |
| Lower plate electrode temperature: | Tsus = 380° C. |
| Substrate surface temperature: | Tsub = 349° C. |

(Semiconductor Layer Growth)

| | |
|---|---|
| Time: | t = 300 sec |
| | (growth rate 0.192 nm/sec) |
| Silane flow rate: | SiH$_4$ = 95 SCCM |
| Argon flow rate: | Ar = 7000 SCCM |
| | (source concentration 1.34%) |
| High frequency power: | RF = 600 W (0.228 W/cm$^2$) |
| Pressure: | P = 1.75 Torr |
| Electrode separation: | S = 36.8 mm |
| Lower plate electrode temperature: | Tsus = 380° C. |
| Substrate surface temperature: | Tsub = 349° C. |

(Hydrogen Plasma Processing 2)

| | |
|---|---|
| Time: | t = 20 sec |
| Hydrogen flow rate: | H$_2$ = 1000 SCCM |
| High frequency power: | RF = 100 W (0.038 W/cm$^2$) |
| Pressure: | P = 0.2 Torr |
| Electrode separation: | S = 23.0 mm |
| Lower plate electrode temperature: | Tsus = 380° C. |

(Hydrogen Plasma Processing 3)

| | |
|---|---|
| Time: | t = 20 sec |
| Hydrogen flow rate: | H$_2$ = 1000 SCCM |
| High frequency power: | RF = 100 W (0.038 W/cm$^2$) |
| Pressure: | P = 0.2 Torr |
| Electrode separation: | S = 48.0 mm |
| Lower plate electrode temperature: | Tsus = 380° C. |

(Vacuum 3)

| | |
|---|---|
| Time: | t = 20 sec |
| (gases not flowing) | |
| High frequency power: | RF = 0 W (no plasma) |
| Pressure: | P = 1 × 10$^{-4}$ Torr |
| Electrode separation: | S = 23.3 mm |
| Lower plate electrode temperature: | Tsus = 380° C. |

(Oxygen Plasma Processing 2)

| | |
|---|---|
| Time: | t = 20 sec |
| Oxygen flow rate: | O$_2$ = 3000 SCCM |
| High frequency power: | RF = 900 W (0.342 W/cm$^2$) |

(Preheat 1)

| | |
|---|---|
| Pressure: | P = 1.0 Torr |
| Electrode separation: | S = 23.3 mm |
| Lower plate electrode temperature: | Tsus = 380° C. |

(Vacuum 4)

| | |
|---|---|
| Time: | t = 20 sec |
| (gases not flowing) | |
| High frequency power: | RF = 0 W (no plasma) |
| Pressure: | P = 1 × 10$^{-4}$ Torr |
| Electrode separation: | S = 23.3 mm |
| Lower plate electrode temperature: | Tsus = 380° C. |

The process above occurs consecutively in a single reaction chamber. In Preheat 1, because the pressure is set somewhat high at 3.0 Torr, the thermal conductivity from the lower plate electrode to the substrate is good; and the total heating time can be shortened to 1 minute and 30 seconds even if room-temperature glass substrates are loaded directly into the reaction chamber. The thickness of underlevel protection layer 12 is roughly 240 nm. In order to improve the quality of the underlevel protection layer, oxygen and hydrogen plasma processing are sandwiched around a vacuum step. As a result, the adhesion between the underlevel protection layer and the semiconductor layer increases, and it becomes difficult to damage the semiconductor layer in the subsequent first annealing process even if the semiconductor layer is subjected to high energies. In other words, because it is possible to carry out the first annealing process at high energy density, it becomes possible to attain a high quality crystallized layer. Under the conditions given above, the semiconductor layer deposition rate is 0.192 nm/sec and the semiconductor film thickness is 57.6 nm. Additionally, the hydrogen concentration in the silicon film is about 2.5 atomic percent as measured by thermal desorption spectroscopy (TDS). Following semiconductor layer deposition, the surface of the semiconductor layer is exposed to hydrogen and oxygen plasma. By so doing, the surface of the semiconductor layer can be passivated; and contamination of the semiconductor layer from the atmosphere can be prevented even after the substrate is removed from the growth chamber. During this process, it is essential that the hydrogen plasma processing be conducted prior to the oxygen plasma processing. This is because it is possible to keep the incorporation of oxygen into the semiconductor layer to an absolute minimum by first passivating the extremely chemically active dangling bonds through hydrogen plasma processing and then forming a thin, protective oxide layer over the surface of the semiconductor layer through oxygen plasma processing.

Next, thermal treatment prior to the first annealing step is carried out under an argon-hydrogen atmosphere (argon from about 96 to 99%, hydrogen from about 1 to 4%; in this example, argon 97% and hydrogen 3%). By means of the thermal treatment, lightly bound hydrogen in the semiconductor layer is released simultaneously with an increase in the density of the semiconductor layer, which allows the semiconductor layer to be subjected to high energy during the first annealing process in the next step. In normal thermal processing, there are chemically active dangling bonds (on which impurities can be adsorbed or be captured easily) remaining after hydrogen is liberated from the semiconductor layer. With the thermal processing in a hydrogen-containing atmosphere in the present example, however, because hydrogen is adsorbed or bound by the extremely chemically active dangling bonds, only chemically inactive dangling bonds remain after thermal processing. This means that the purity of the semiconductor can be improved since both the adsorption of contaminants such as atmospheric dust and moisture and the incorporation of oxygen into a semiconductor layer thermally processed as in this example is limited.

The first annealing process is performed following thermal processing. Just prior to carrying out the first annealing process, the surface of the semiconductor layer is cleaned with acids and alkaline solutions. Additionally, the oxide layer formed on the surface of the semiconductor is removed; and a clean semiconductor surface is exposed. Because the first annealing step occurs at extremely high temperatures including a melt process, impurities would be incorporated into the semiconductor layer during the first annealing step if such cleaning processing were not performed. Impurity incorporation would result in a low-quality crystalline semiconductor layer as a result of small grain size and the creation of unnecessary states in the forbidden band. In the present invention, the first annealing process is performed immediately after exposing a clean semiconductor layer surface. Accordingly, the semiconductor layer is a high purity, high-quality layer with large grains and few states in the forbidden band. In this example, the first annealing process is performed immediately after the semiconductor layer surface is cleaned using a mixture of aqueous ammonia ($NH_4OH$) and hydrogen peroxide ($H_2O_2$) and the oxide layer is removed using buffered hydrofluoric acid ($HF \cdot H_2O$).

Crystallization is effected through the first annealing process of the semiconductor layer. In this example, multi-step annealing irradiation using a krypton fluoride (KrF) excimer laser (wavelength of 248 nm) was performed. The full width at half maximum intensity (that is, the first annealing process time) of the laser pulse is approximately 33 nsec. Laser irradiation was performed on substrates at room temperature (25° C.) under an argon atmosphere containing about 3% hydrogen at atmospheric pressure. The partial pressures of gases such as oxygen and water vapor were at or below $10^{-5}$ atm. The shape of the region irradiated by the laser was a line approximately 120 μm wide and about 40 cm long, and crystallization was achieved by scanning this laser line. With each irradiation, the overlap in the direction of the width of the beam is about 90% of the beam width. The laser irradiation energy density was 180 mJ·cm$^{-2}$ for the first scan, 200 mJ·cm$^{-2}$ for the second scan, 220 mJ·cm$^{-2}$ for the third scan, 240 mJ·cm$^{-2}$ for the fourth scan, 260 mJ·cm$^{-2}$ for the fifth scan, and 280 mJ·cm$^{-2}$ for the sixth scan. Because the ratio of beam overlap is 90% and a 6-step irradiation was performed, the same location of the semiconductor is laser irradiated a total of 60 times. In this invention, because the incorporation of impurities into the semiconductor layer is limited to a minimum as a result of the strict control of the atmosphere during hydrogen and oxygen plasma treatments and during the thermal processing preceding the first annealing step, such a multi-stage irradiation process is possible. The result is that a high-quality crystallized film can be obtained.

Next, the second annealing process is carried out using RTA. In this example, the second annealing process was performed using the conditions for sample 5 in Table 1. The atmosphere during RTA was oxygen at approximately one atmosphere (atmospheric pressure). By so doing, a thin oxide layer is formed on the surface of the semiconductor layer so that it is possible to prevent contamination of the semiconductor layer by resist and other contaminants during the subsequent patterning of the semiconductor layer. Because this oxide layer is a contaminant during patterning, it is necessary to remove the layer at the time of gate insulator layer formation. Additionally, by means of the method of this example, oxide layer formation acts simultaneously with the principles in Section 1. Because strong stresses act normally on semiconductor films during oxide layer formation, the principles explained in Section 1 function more effectively. In this sense, it can be said that carrying out the second annealing step in an oxidizing environment is desirable. Semiconductor layer 13 of the present invention is obtained in this fashion (FIG. 1(a)).

Figure 1B:
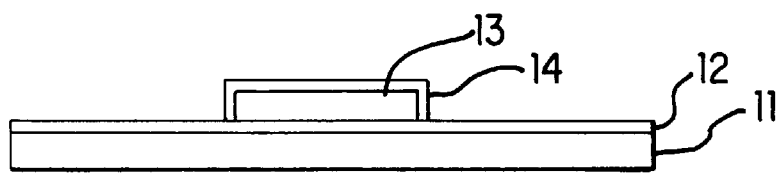
Figure 1C:
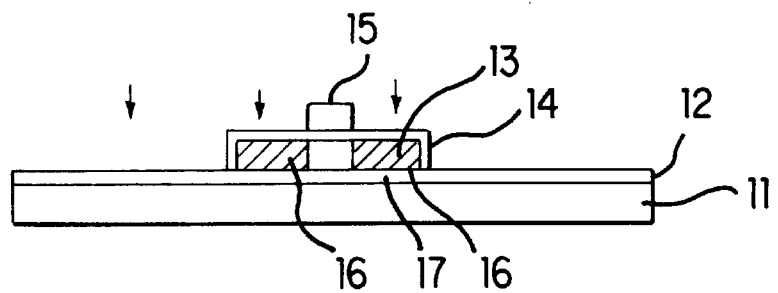
Figure 1D:
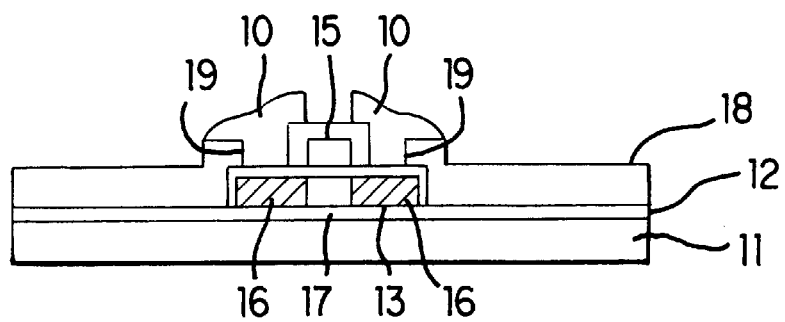
Figure 2B:
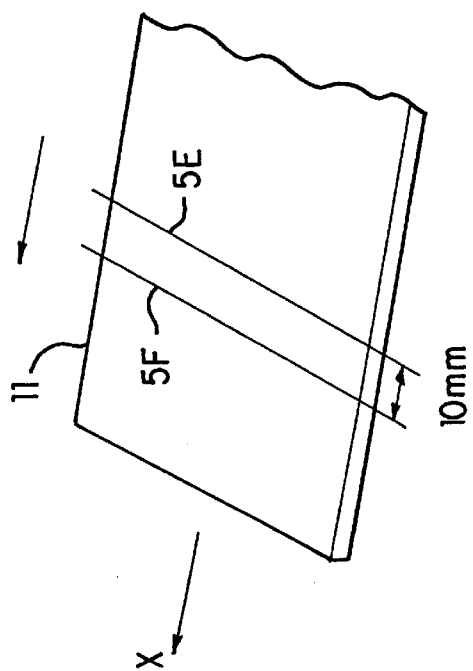
FIG. 2(b) explains the annealing state during the second annealing step.

Next, following patterning of the semiconductor layer, immediately after cleaning of the semiconductor layer surface using ammonia and hydrogen peroxide and removal of the oxide layer using buffered hydrofluoric acid, gate insulator layer 14 is formed by PECVD (FIG. 1(b)). The gate insulator layer, which is comprised of a silicon oxide film, is deposited to a thickness of 100 nm at a substrate surface temperature of 350° C. using TEOS (Si—(O—CH$_2$—CH$_3$)$_4$), oxygen ($O_2$) and water ($H_2O$) as source gases and argon as a dilution gas. After deposition of the gate insulator layer, annealing in an oxygen atmosphere containing water vapor with a dew point of roughly 60° C. at almost 300° C. and atmospheric pressure for about one hour is performed. This annealing improves the insulator film and a good gate insulator layer is formed.

Then a tantalum (Ta) thin film, which becomes gate electrode 15, is deposited by means of sputtering. The substrate temperature at the time of sputtering is 150° C., and the film thickness is 500 nm. Patterning is carried out after the tantalum thin film, which is to become the gate electrode, is deposited. This is followed by implantation of impurity ions in the semiconductor layer and formation of source and drain regions 16 and channel region 17 (FIG. 1(c)). In this example, because CMOS TFTs are being formed, NMOS TFTs and PMOS TFTs are formed on a single substrate. The PMOS TFTs are covered with polyimide during formation of the sources and drains of the NMOS TFTs; conversely, the NMOS TFTs are covered with polyimide during formation of the sources and drains of the PMOS TFTs, thereby making CMOS TFTs. At this time, the gate electrode serves as a mask for ion implantation, and the channel becomes a self-aligned structure that is formed only below the gate electrode. Impurity ion implantation is carried out using a non-mass separating ion implanter and phosphine (PH$_3$) or diborane (B$_2$H$_6$) diluted by hydrogen to a concentration of approximately 5% as the source gas. For NMOS, the total ion implantation dose, including ions such as PH$_3^+$ and H$_2^+$, is $1 \times 10^{16}$ cm$^{-2}$ and the phosphorous atom concentration in the source and drain regions is approximately $3 \times 10^{20}$ cm$^{-3}$. Similarly, for PMOS, the total ion implantation dose, including ions such as B$_2$H$_6^+$ and H$_2^+$, is also $1 \times 10^{16}$ cm$^{-2}$ and the boron atom concentration in the source and drain regions is approximately $3 \times 10^{20}$ cm$^{-3}$. The substrate temperature at the time of ion implantation is 250° C.

Next, interlevel insulator layer 18, comprised of a silicon oxide film, is formed by means of PECVD using TEOS. The substrate surface temperature during interlevel insulator layer deposition is 350° C., and the layer thickness is 500 nm. After the interlevel insulator layer is formed, thermal annealing is performed for 1 hour at 350° C. in an oxygen atmosphere to achieve activation of implanted ions and densification of the interlevel insulator layer. Contact holes are then opened to the source and drain regions, and aluminum (Al) is deposited by means of sputtering. The substrate temperature during sputtering is 150° C., and the film thickness is 500 nm. Patterning is carried out on the aluminum thin film source and drain electrodes 10 and interconnects to complete the thin film semiconductor device (FIG. 1(d)).

In this example, with the goal of investigating the transistor performance and the nonuniformity within a single substrate, 50 transistors uniformly fabricated over a large substrate and having channel lengths L=5 μm and widths W=5 μm were measured. The results are as shown below. The on current is defined at $|V_{ds}|$=4 V and $|V_{gs}|$=10 V while the off current is defined at $|V_{ds}|$=4 V and $|V_{gs}|$=0 V.

NMOS TFT

I ON=(80.5+9.7, −7.4)×10$^{-6}$ A

I OFF=(1.54+0.58, −0.41)×10$^{-12}$ A

μ=134.4±13.6 cm$^2$·V$^{-1}$·sec$^{-1}$

Vth=2.07±0.16 V

PMOS TFT

I ON=(55.9+5.1, −4.4)×10$^{-6}$ A

I OFF=(4.21+1.08, −0.87)×10$^{-13}$ A

μ=75.1±6.5 cm$^2$·V$^{-1}$·sec$^{-1}$

Vth=−1.02±0.10 V

As described, this invention enabled the uniform fabrication of extremely good CMOS thin film semiconductor devices having high mobility on large, conventional glass substrates. The uniformity of laser crystallization, whether within a substrate or from lot to lot, has been a very serious problem in the low temperature process of the prior art. This invention, however, greatly reduces the nonuniformity of both on currents and off currents. This marked improvement in uniformity speaks for the validity of the fundamental principles of the present invention (Section 1). Following such principles, this invention achieves marked improvement even with respect to lot-to-lot fluctuations. As described, this invention enables silicon and other semiconductor films to be crystallized extremely reliably by means of laser or other high energy optical irradiation. Therefore, LCDs employing thin film semiconductor devices of this invention exhibit uniform high picture quality across the entire screen. Moreover, the thin film semiconductor devices of this invention can also easily be used to form not only simple circuits such as shift registers and analog switches but also more complex circuits such as level shifters, digital to analog converter circuits and even clock generator circuits, gamma correction circuits, and timing controller circuits.

Example 6

An active matrix substrate for a color LCD, having 200 (rows)×320 (columns)×3 (colors)=192,000 pixel switching elements using NMOS thin film semiconductor devices obtained as described in Example 5 and integrated 6-bit digital data drivers (column drivers) and scanning drivers (row drivers) using CMOS TFTs obtained as described in Example 5, was produced. The digital data driver of this example is comprised of a clock signal line and clock generator circuit, shift register circuit, NOR gates, digital video signal lines, latch circuit 1, latch pulse line, latch circuit 2, reset line 1, AND gates, reference voltage line, reset line 2, 6-bit capacitance division D/A converter, CMOS analog switches, common voltage line, and a source line reset transistor. The outputs from the CMOS analog switches is connected to the pixel source lines. The capacitance of the D/A converter portion satisfies the relationship $C_0=C_1/2=C_2/4=C_3/8=C_4/16=C_5/32$. Digital video signals output from the video random access memory (VRAM) of a computer can be input directly to the digital video signal lines. In the pixel portion of the active matrix substrate described in this example, the source electrodes, source interconnects, and drain electrode (pixel electrode) are comprised of aluminum, forming a reflective LCD. A liquid crystal panel was produced that employed an active matrix substrate achieved as described for one of the two substrates in the substrate pair. A normally-black mode (the display is black when a voltage is not being applied to the liquid crystal) reflective liquid crystal panel was made using a polymer-dispersed liquid crystal (PDLC) with dispersed black pigment for the liquid crystal held between the substrate pair. This liquid crystal panel was connected to external wiring to produce a liquid crystal display. The result was a liquid crystal display device having high display quality: both the on resistance and transistor capacitance of the NMOS and PMOS were equal; moreover, the TFTs offered high performance, while the parasitic capacitance of the transistors was extremely low; and, because the characteristics were uniform over the entire substrate, both 6-bit digital data drivers and scanning drivers operated normally in a wide operating region. In the pixel region, since the aperture ratio was high, a high display quality liquid crystal device was achieved even with a dispersed black pigment PDLC. In addition, because the manufacturing process for the active matrix substrate is reliable, liquid crystal display devices can be manufactured reliably and at low cost.

Using the solar cell obtained in Example 4 as an auxiliary power supply, the liquid crystal display obtained as explained was installed in the body of a full-color portable personal computer (notebook PC). Since the active matrix substrate was equipped with integrated 6-bit digital data drivers and since digital video signals from the computer were input directly to the liquid crystal display device, the circuit configuration was simplified, while power consumption was simultaneously reduced to an extremely low level. The high performance of the liquid crystal thin film semiconductor device gave this notebook PC an extremely attractive display screen and made it a good electronic device. In addition, because this is a reflective liquid crystal display device with high aperture ratio, a backlight was unnecessary. The absence of a backlight and the integration of a high conversion efficiency solar cell as an auxiliary power supply made it possible to decrease the size and weight of the batteries while simultaneously extending the length of time they can be used. Accordingly, an extremely small, light-weight electronic device with a beautiful display screen that has the potential for long-time use was fabricated.

As stated above, the method of fabricating crystalline semiconductor layers and the method of fabricating cells thin film semiconductor devices such as thin film transistors and solar cells using such crystalline semiconductor layers described by this invention enable the manufacture of high performance thin film semiconductor devices using a low temperature process in which inexpensive glass substrates can be used. Therefore, applying this invention to the manufacture of active matrix liquid crystal display devices permits large-size, high-quality liquid crystal display devices to be manufactured easily and reliably; and, when used in solar cells, high conversion efficiency solar cells can be fabricated. Moreover, when this invention is applied to the manufacture of other electronic circuits, high quality electronic circuits can also be manufactured easily and reliably.

Additionally, because of their low cost and high performance, the thin film semiconductor devices of this invention are perfectly suited as the active matrix substrate of an active matrix liquid crystal display device. They are optimum devices to use as integrated-driver active matrix substrates that demand particularly high performance.

Their low cost and high performance also make the liquid crystal displays of the present invention optimum for full-color notebook PCs and other types of displays.

Finally, because of their low cost and high performance, the electronic devices of this invention will likely gain wide general acceptance.

What is claimed is:

1. A method for forming crystalline semiconductor films on a substrate, comprising:
   a semiconductor film deposition process in which a semiconductor film is deposited on a substrate,
   a first annealing process in which said semiconductor film is crystallized by repeatedly performing a process that melt crystallizes a portion of said semiconductor film, and
   a second annealing process in which rapid thermal annealing is performed on said crystallized semiconductor film,
   wherein an annealing temperature in the second annealing process is expressed by the absolute temperature T and, when the annealing time is t, expressed in seconds, annealing temperature T and annealing time t satisfy the relationship:

$$1.72 \times 10^{-21} sec < t \cdot \exp(-\epsilon/kT) < 4.63 \times 10^{-14} sec$$

wherein $\epsilon = 3.01$ eV and $k = 8.617 \times 10^{-5}$ eV/K.

2. A method for forming the crystalline semiconductor film according to claim 1, wherein an annealing temperature in the second annealing process is expressed by the absolute temperature T and, when the annealing time is t, expressed in seconds, annealing temperature T and annealing time t satisfy the relationship:

$$5 \times 10^{-18} sec < t \cdot \exp(-\epsilon/kT) < 4.63 \times 10^{-14} sec$$

wherein $\epsilon = 3.01$ eV and $k = 8.617 \times 10^{-5}$ eV/K.

3. A method for forming the crystalline semiconductor film according to claim 1, wherein an annealing temperature in the second annealing process is expressed by the absolute temperature T and, when the annealing time is t, expressed in seconds, annealing temperature T and annealing time t satisfy the relationship:

$$1.72 \times 10^{-21} sec < t \cdot \exp(-\epsilon/kT) < 1.09 \times 10^{-15} sec$$

wherein $\epsilon = 3.01$ eV and $k = 8.617 \times 10^{-5}$ eV/K.

4. A method for forming the crystalline semiconductor film according to claim 1, wherein an annealing temperature in the second annealing process is expressed by the absolute temperature T and, when the annealing time is t, expressed in seconds, annealing temperature T and annealing time t satisfy the relationship:

$$5 \times 10^{-18} sec < t \cdot \exp(-\epsilon/kT) < 1.09 \times 10^{-15} sec$$

wherein $\epsilon = 3.01$ eV and $k = 8.617 \times 10^{-5}$ eV/K.

5. A method for forming the crystalline semiconductor film according to claim 3, wherein said substrate is glass and said annealing temperature T is below a strain point of said glass substrate.

6. A method for forming the crystalline semiconductor film according to claim 1, wherein said annealing time t is 300 seconds.

7. A method for forming the crystalline semiconductor film according to claim 1, wherein said annealing time t is 180 seconds or less.

8. A method for fabricating thin film transistors using a semiconductor film formed on a substrate, comprising:
   a semiconductor film deposition process in which a semiconductor film is deposited on a substrate,
   a first annealing process in which said semiconductor film is crystallized by repeatedly performing a process that melt crystallizes a portion of said semiconductor film, and
   a second annealing process in which rapid thermal annealing is performed on said crystallized semiconductor film,
   wherein an annealing temperature in the second annealing process is expressed by the absolute temperature T and, when the annealing time is t, expressed in seconds, annealing temperature T and annealing time t satisfy the relationship:

$$1.72 \times 10^{-21} sec < t \cdot \exp(-\epsilon/kT) < 4.63 \times 10^{-14} sec$$

wherein $\epsilon = 3.01$ eV and $k = 8.617 \times 10^{-5}$ eV/K.

9. A method for fabricating solar cells using a semiconductor film formed on a substrate, comprising:
   a semiconductor film deposition process in which a semiconductor film is deposited on a substrate,
   a first annealing process in which said semiconductor film is crystallized by repeatedly performing a process that melt crystallizes a portion of said semiconductor film, and
   a second annealing process in which rapid thermal annealing is performed on said crystallized semiconductor film,
   wherein an annealing temperature in the second annealing process is expressed by the absolute temperature T and, when the annealing time is t, expressed in seconds, annealing temperature T and annealing time t satisfy the relationship:

$$1.72 \times 10^{-21} sec < t \cdot \exp(-\epsilon/kT) < 4.63 \times 10^{-14} sec$$

wherein $\epsilon = 3.01$ eV and $k = 8.617 \times 10^{-5}$ eV/K.

* * * * *